US012586170B2

(12) United States Patent    (10) Patent No.:    US 12,586,170 B2

Pisarenco et al.    (45) Date of Patent:    Mar. 24, 2026

(54) SYSTEM AND METHOD FOR GENERATING PREDICTIVE IMAGES FOR WAFER INSPECTION USING MACHINE LEARNING

(71) Applicant: ASML Netherlands B.V., Veldhoven (NL)

(72) Inventors: Maxim Pisarenco, Son en Breugel (NL); Scott Anderson Middlebrooks, Duizel (NL); Mark John Maslow, Eindhoven (NL); Marie-Claire Van Lare, Utrecht (NL); Chrysostomos Batistakis, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 319 days.

(21) Appl. No.: 17/761,578

(22) PCT Filed: Sep. 14, 2020

(86) PCT No.: PCT/EP2020/075675

§ 371 (c)(1),
(2) Date: Mar. 17, 2022

(87) PCT Pub. No.: WO2021/052918

PCT Pub. Date: Mar. 25, 2021

(65) Prior Publication Data

US 2022/0375063 A1    Nov. 24, 2022

Related U.S. Application Data

(60) Provisional application No. 63/001,055, filed on Mar. 27, 2020, provisional application No. 62/903,568, filed on Sep. 20, 2019.

(51) Int. Cl.
| | |
|---|---|
| *G06T 7/00* | (2017.01) |
| *G03F 7/00* | (2006.01) |
| *G06V 10/77* | (2022.01) |
| *G06V 10/82* | (2022.01) |

(52) U.S. Cl.
CPC ............ *G06T 7/0004* (2013.01); *G03F 7/705* (2013.01); *G06V 10/7715* (2022.01); (Continued)

(58) Field of Classification Search
USPC .................. 216/2–109; 378/1–90, 154–161; 382/112–225; 430/1–125; 438/7–43,
(Continued)

(56) References Cited

U.S. PATENT DOCUMENTS

| | | | | |
|---|---|---|---|---|
| 8,279,409 | B1 * | 10/2012 | Sezginer | .................. G03F 1/70 |
| | | | | 716/55 |
| 10,395,361 | B2 * | 8/2019 | Sezginer | ................ G03F 7/705 |

(Continued)

FOREIGN PATENT DOCUMENTS

| | | |
|---|---|---|
| CN | 109242033 A | 1/2019 |
| TW | 201809856 A | 3/2018 |

(Continued)

OTHER PUBLICATIONS

Lal Vasudev; Systems, Methods, and Apparatuses for Modeling Reticle Compensation for Post Lithography Processing Using Machine Learning Algorithms; 2017 (Year: 2017).*

(Continued)

*Primary Examiner* — Marcellus J Augustin

(74) *Attorney, Agent, or Firm* — FINNEGAN, HENDERSON, FARABOW, GARRETT & DUNNER LLP

(57)    ABSTRACT

A system and method for generating predictive images for wafer inspection using machine learning are provided. Some embodiments of the system and method include acquiring the wafer after a photoresist applied to the wafer has been developed; imaging a portion of a segment of the developed wafer; acquiring the wafer after the wafer has been etched; imaging the segment of the etched wafer; training a machine (Continued)

learning model using the imaged portion of the developed wafer and the imaged segment of the etched wafer; and applying the trained machine learning model using the imaged segment of the etched wafer to generate predictive images of a developed wafer. Some embodiments include imaging a segment of the developed wafer; imaging a portion of the segment of the etched wafer; training a machine learning model; and applying the trained machine learning model to generate predictive after-etch images of the developed wafer.

19 Claims, 14 Drawing Sheets

(52) U.S. Cl.
CPC .... *G06V 10/82* (2022.01); *G06T 2207/10061* (2013.01); *G06T 2207/20081* (2013.01); *G06T 2207/20084* (2013.01); *G06T 2207/30148* (2013.01)

(58) Field of Classification Search
USPC .................................................. 438/689–753
See application file for complete search history.

(56) References Cited

U.S. PATENT DOCUMENTS

| | | |
|---|---|---|
| 2003/0082463 A1 | 5/2003 | Laidig et al. |
| 2017/0191948 A1 | 7/2017 | Gao et al. |
| 2018/0082415 A1* | 3/2018 | Sezginer ................. G06T 7/001 |
| 2018/0225823 A1 | 8/2018 | Zhou et al. |
| 2020/0265573 A1* | 8/2020 | Tsai ........................ G06T 7/001 |

FOREIGN PATENT DOCUMENTS

| | | |
|---|---|---|
| TW | 201931217 A | 8/2019 |
| WO | WO 2017/171891 A1 | 10/2017 |
| WO | WO 2018/125219 A1 | 7/2018 |

OTHER PUBLICATIONS

Zhang Youping; Determining Pattern Ranking Based On Measurement Feedback From Printed Substrate; 2020 (Year: 2020).*

Pan, Xiao-Dong; Wafer Defect Pattern Classification Method And Device, Storage Medium And Electronic Device; 2019 (Year: 2019).*

International Search Report and Written Opinion issued by the International Searching Authority in related International Application No. PCT/EP2020/075675, mailed Dec. 9, 2020 (2 pgs.).

Office Action issued by the Intellectual Property Office (IPO) in related ROC (Taiwan) Patent Application No. 109131800, issued May 31, 2021 (25 pgs.).

Zhang Peng, et al. Prediction of Mechanical Property of Gd2O3/6061AI Neutron Shielding Material Based on Convolutional Neural Network Model, Atomic Energy Science and Technology, vol. 54, No. 8, Aug. 2020, 6 pages.

* cited by examiner

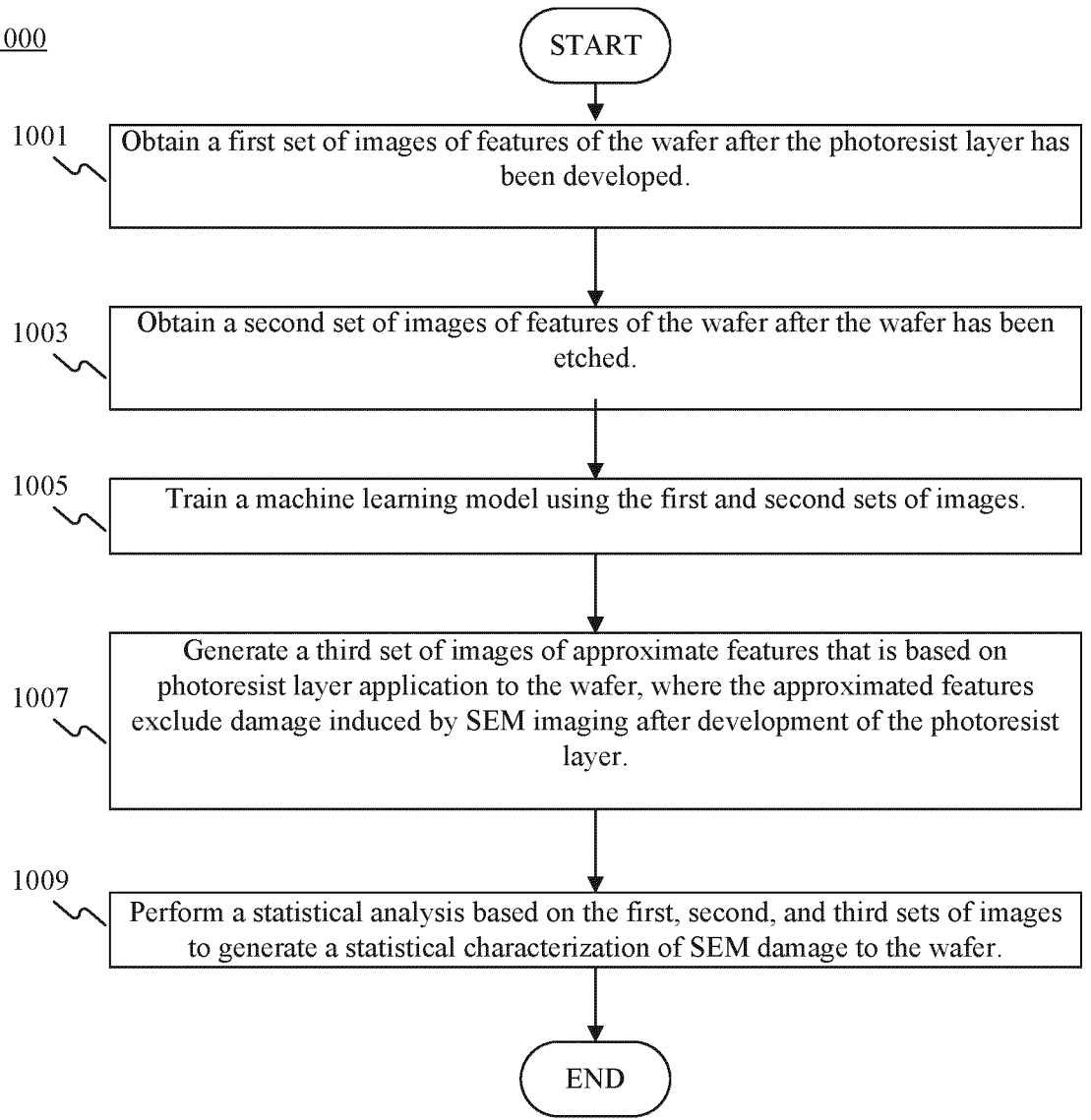

1000

START

1001 — Obtain a first set of images of features of the wafer after the photoresist layer has been developed.

1003 — Obtain a second set of images of features of the wafer after the wafer has been etched.

1005 — Train a machine learning model using the first and second sets of images.

1007 — Generate a third set of images of approximate features that is based on photoresist layer application to the wafer, where the approximated features exclude damage induced by SEM imaging after development of the photoresist layer.

1009 — Perform a statistical analysis based on the first, second, and third sets of images to generate a statistical characterization of SEM damage to the wafer.

END

FIG. 10

SYSTEM AND METHOD FOR GENERATING PREDICTIVE IMAGES FOR WAFER INSPECTION USING MACHINE LEARNING

CROSS-REFERENCE TO RELATED APPLICATIONS

This application claims priority to International Application No. PCT/EP2020/075675, filed Sep. 14, 2020, and published as WO 2021/052918 A1, which claims priority of U.S. application 62/903,568 which was filed on Sep. 20, 2019, and U.S. application 63/001,055 which was filed on Mar. 27, 2020. The contents of these applications are incorporated herein by reference in their entireties.

TECHNICAL FIELD

The present disclosure generally relates to the field of inspecting a wafer using a charged particle beam system to generate predictive images of the wafer using machine learning.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments consistent with the present disclosure include systems and methods for inspecting a wafer in a charged particle system using machine learning. The system includes a controller including circuitry to image a portion of a segment of a wafer after a photoresist applied to the wafer has been developed; image the segment of the wafer after the wafer has been etched; and train a machine learning model using the imaged portion of the developed wafer and the imaged segment of the etched wafer.

The method for inspection includes acquiring the wafer after a photoresist applied to the wafer has been developed; imaging a portion of a segment of the developed wafer; acquiring the wafer after the wafer has been etched; imaging the segment of the etched wafer; and training a machine learning model using the imaged portion of the developed wafer and the imaged segment of the etched wafer.

The method for training the machine learning model includes inputting a first set of images of a portion of a segment of a photoresist applied to a wafer that has been developed into a machine learning model; inputting a second set of images of the segment of the wafer after the wafer has been etched into the machine learning model; and adjusting weights of the machine learning model based on the first and second set of images, wherein the trained machine learning model is configured to generate predictive images of other portions of the segment of the developed wafer.

The non-transitory computer readable medium stores a set of instructions that is executable by at least one processor of a computing device to cause the computing device to perform a method for inspecting a wafer, the method comprising imaging a portion of a segment of a wafer after a photoresist applied to the wafer has been the developed; imaging the segment of the wafer after the wafer has been etched; and training a machine learning model using the imaged portion of the developed wafer and the imaged segment of the etched wafer.

Embodiments consistent with the present disclosure include systems and methods for inspecting a wafer in a charged particle system using machine learning. The system includes a controller including circuitry to image a segment of a wafer after a photoresist applied to the wafer has been developed; image a portion of the segment of the wafer after the wafer has been etched; and train a machine learning model using the imaged segment of the developed wafer and the imaged portion of the etched wafer.

The method for inspection includes acquiring the wafer after a photoresist applied to the wafer has been developed; imaging a segment of the developed wafer; acquiring the wafer after the wafer has been etched; imaging a portion of the segment of the etched wafer; and training a machine learning model using the imaged segment of the developed wafer and the imaged portion of the etched wafer.

The method for training the machine learning model includes inputting a first set of images of a portion of a segment of a photoresist applied to a wafer that has been etched into a machine learning model; inputting a second set of images of the segment of the wafer after the wafer has been developed into the machine learning model; and adjusting weights of the machine learning model based on the first and second set of images, wherein the trained machine learning model is configured to generate predictive after-etch images of other portions of the segment of the developed wafer.

The non-transitory computer readable medium stores a set of instructions that is executable by at least one processor of a computing device to cause the computing device to perform a method for inspecting a wafer, the method comprising imaging a segment of a wafer after a photoresist applied to the wafer has been the developed; imaging a portion of the segment of the wafer after the wafer has been etched; and training a machine learning model using the imaged segment of the developed wafer and the imaged portion of the etched wafer.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF DRAWINGS

FIG. 10 is a flowchart representing an exemplary method of wafer inspection, consistent with embodiments of the present disclosure.

DETAILED DESCRIPTION

Figure 1:
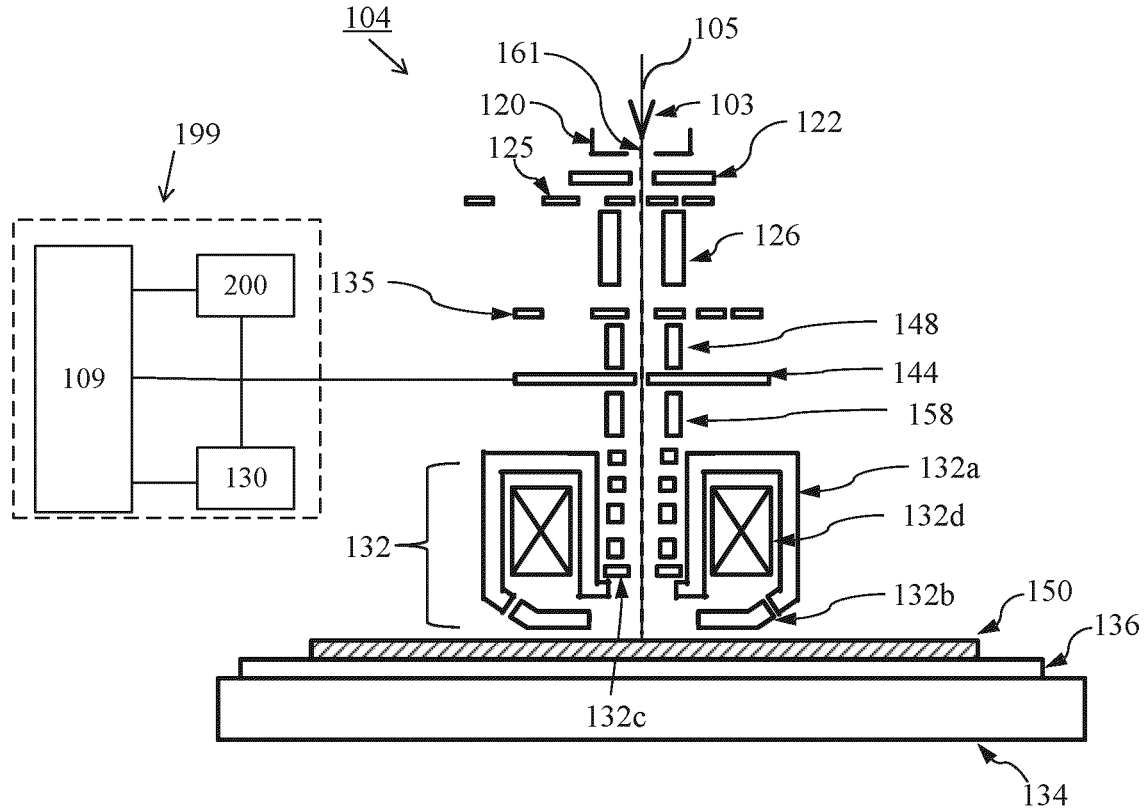
FIG. 1 is a schematic diagram illustrating an exemplary electron beam tool, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $\frac{1}{1000}$th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective then the process can be adjusted so the defect is less likely to recur.

As stated above, inspection can occur at various stages. For examples, images of the wafer can be taken after a photoresist applied to the wafer has been developed (e.g., after lithography), after etching, among other stages. Inspection of the wafer after development may be desired since it provides a direct connection between the SEM images obtained during inspection and the various exposure process conditions (e.g., focus, dose, etc.) that define the patterning performance Inspection of the wafer after development may allow the exposure process conditions to be optimized. The SEM images obtained after development may be used for defect detection (e.g., necking, bridging, etc.), roughness/randomness characterization (e.g., line edge/width roughness, local critical dimension uniformity, edge placement error), process window optimization, calibration of the computational lithography model, and process performance monitoring and control. The SEM images obtained after development may also be used to generate predictive images of the wafer after etching. Inspection of the wafer after development may allow the wafer to be reworked based on the inspection metrology results. That is, after etch, the wafer can no longer be returned to a previous process state so that the wafer can be re-processed to improve inspection results. It is thus important to obtain SEM images of the printed pattern of the wafer after development and before etching.

SEM inspection after development, however, suffers from constraints due to the effects of SEM inspection itself. SEM inspection involves bombarding a sample with electrons. Because photoresists may be sensitive to electrons, a photoresist may shrink or compress a non-negligible amount as a result of SEM inspection. That is, SEM inspection may damage the photoresist on the wafer, altering the pattern of the wafer. This alteration may result in modified key performance indicators (e.g., defects, line-edge roughness, line-width roughness, local critical dimension uniformity, etc.) that are not reflective of the true key performance indicators of the wafer when it has not been inspected by the SEM after development.

Some models use parameters that are known from etching physics and materials to generate predictive images of the wafer after etching. These models, however, may not generate accurate predictive images because the actual physical parameters of the etching may not be known in practice. Some models tune or calibrate parameters to minimize the difference between physics-based models and predictive images. But these models may not generate accurate predictive images because they do not have enough capacity to represent the complex relationships present in the data.

The disclosed embodiments provide systems and methods that include machine learning models that address some or all of these disadvantages. The disclosed embodiments provide systems and methods that may generate predictive SEM images of a wafer after development using a machine learning model and a SEM image of the wafer after etching, thereby allowing for less or no wafer damage, more accurate metrology of the wafer, and higher throughput.

FIG. 1 illustrates a charged particle beam apparatus in which an electron beam system may comprise a single primary beam that may be configured to generate a secondary beam. A detector may be placed along an optical axis 105, as shown in FIG. 1. In some embodiments, a detector may be arranged off axis.

As shown in FIG. 1, an electron beam tool 104 may include a wafer holder 136 supported by motorized stage 134 to hold a wafer 150 to be inspected. Electron beam tool 104 may be a single-beam system or a multi-beam system. Electron beam tool 104 includes an electron beam source, which may comprise a cathode 103, an anode 120, and a gun aperture 122. Electron beam tool 104 further includes a beam limit aperture 125, a condenser lens 126, a column aperture 135, an objective lens assembly 132, and an electron detector 144. Objective lens assembly 132, in some embodiments, may be a modified swing objective retarding immersion lens (SORIL), which includes a pole piece 132a, a control electrode 132b, a deflector 132c, and an exciting coil 132d. In an imaging process, an electron beam 161 emanating from the tip of cathode 103 may be accelerated by anode 120 voltage, pass through gun aperture 122, beam limit aperture 125, condenser lens 126, and focused into a probe spot by the modified SORIL lens and then impinge onto the surface of mask 170. The probe spot may be scanned across the surface of wafer 150 by a deflector, such as deflector 132c or other deflectors in the SORIL lens. Secondary electrons emanated from the wafer may be collected by detector 144 to form an image of an area of interest on wafer 150.

There may also be provided an image processing system 199 that includes an image acquirer 200, a storage 130, and a controller 109. Image acquirer 200 may comprise one or more processors. For example, image acquirer 200 may comprise a computer, server, mainframe host, terminals, personal computer, any kind of mobile computing devices, and the like, or a combination thereof. Image acquirer 200 may connect with detector 144 of electron beam tool 104 through a medium such as an electrical conductor, optical fiber cable, portable storage media, IR, Bluetooth, internet, wireless network, wireless radio, or a combination thereof. Image acquirer 200 may receive a signal from detector 144 and may construct an image. Image acquirer 200 may thus acquire images of wafer 150. Image acquirer 200 may also perform various post-processing functions, such as generating contours, superimposing indicators on an acquired image, and the like. Image acquirer 200 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 200 and may be used for saving scanned raw image data as original images, and post-processed images. Image acquirer 200 and storage 130 may be connected to controller 109. Controller 109 may be electronically connected to electron beam tool 104. Controller 109 may be a computer configured to execute various controls of electron beam tool 104. In some embodiments, image acquirer 200, storage 130, and controller 109 may be integrated together as one control unit.

In some embodiments, image acquirer 200 may acquire one or more images of a wafer based on an imaging signal received from detector 144. An imaging signal may correspond to a scanning operation for conducting charged particle imaging. An acquired image may be a single image comprising a plurality of imaging areas that may contain various features of wafer 150. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 1, the electron beam tool 104 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape. It is to be appreciated that any number of poles and any number of lenses may be used, as appropriate.

Although FIG. 1 shows electron beam tool 104 as a single-beam inspection tool that may use only one primary electron beam to scan one location of wafer 150 at a time, embodiments of the present disclosure are not so limited. For example, electron beam tool 104 may also be a multi-beam inspection tool that employs multiple primary electron beamlets to simultaneously scan multiple locations on wafer 150.

Figures 2A, 2B:
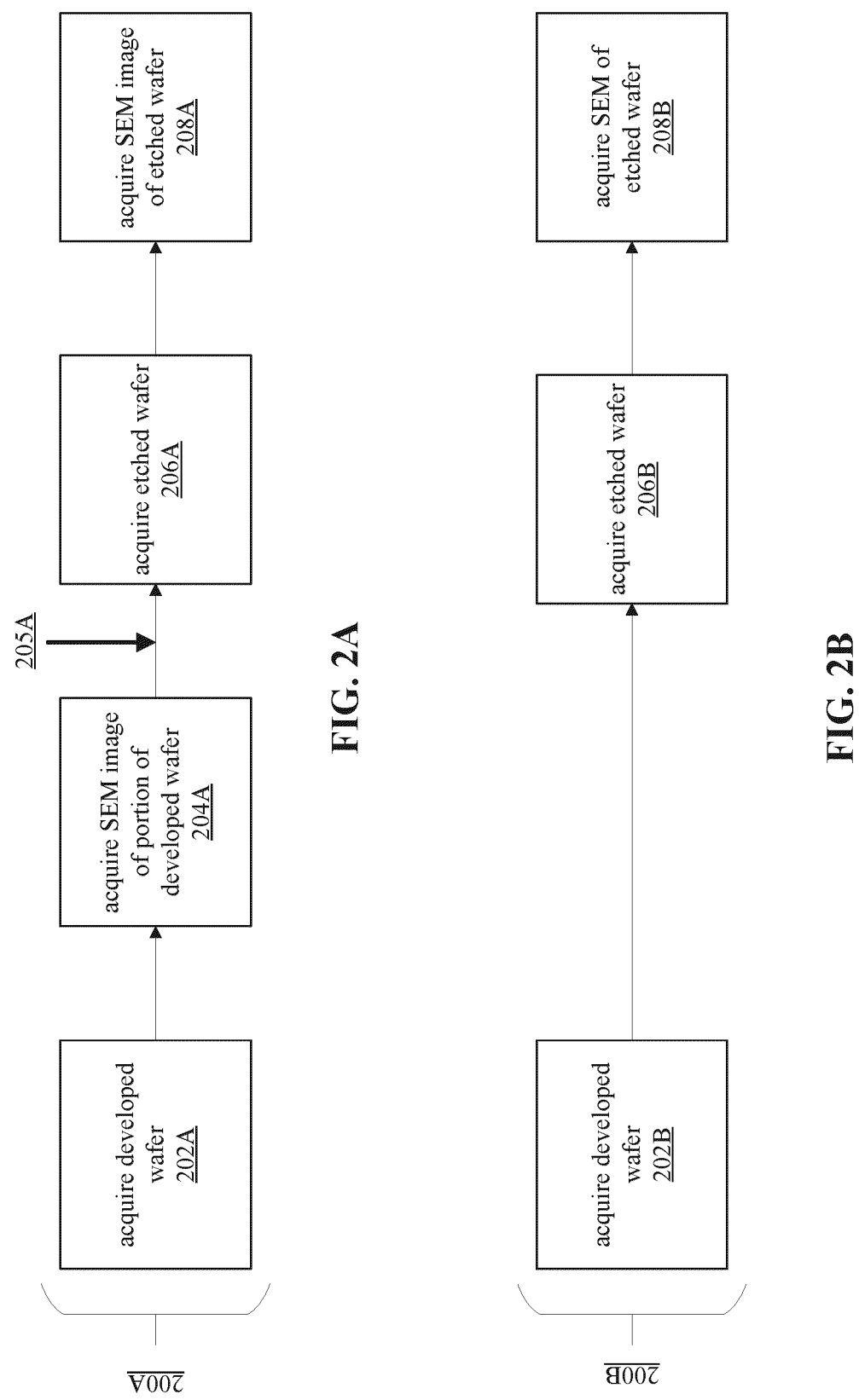
FIG. 2A is a flowchart representing an exemplary method of wafer inspection, consistent with embodiments of the present disclosure.
FIG. 2B is a flowchart representing an exemplary method of wafer inspection, consistent with embodiments of the present disclosure.

FIG. 2A illustrates a flowchart representing an exemplary method of wafer inspection. A wafer inspection process 200A, as shown in FIG. 2A, is often used to inspect a wafer (e.g., wafer 150 of FIG. 1). Wafer manufacturing processes may include, but are not limited to, a development (i.e., lithography) process, an etching process, a chemical mechanical polishing process, or an interconnection forming process. At step 202A, an inspection system (using, e.g., electron beam tool 104 of FIG. 1) may acquire a developed wafer. At step 204A, the system may then acquire a SEM image of a portion of the developed wafer. The portion may be the entire developed wafer. After step 204A at point 205A, the photoresist on the portion of wafer may be damaged from the SEM image capture. The SEM inspection may damage the photoresist on the wafer, thus altering the pattern of the developed wafer. Alteration of the pattern of the wafer may result in modified key performance indicators (e.g., defects, line-edge roughness, line-width roughness, local critical dimension uniformity, etc.) that are not reflective of the true key performance indicators of the wafer when it has not been inspected by the SEM after development (see, e.g., FIG. 3).

While after-development imaging may damage the portion of the wafer that is inspected, inspection of the wafer using the SEM image acquired at step 204A may be desired to observe the direct effect of various exposure process conditions (e.g., focus, dose, etc.) on the wafer after development. For example, the SEM image acquired at step 204A may be used for defect detection (e.g., necking, bridging, etc.), roughness/randomness characterization (e.g., line edge/width roughness, local critical dimension uniformity, edge placement error), process window optimization, calibration of the computational lithography model, and process performance monitoring and control. Additionally, the SEM image acquired at step 204A may be desired to generate predictive images of the wafer after etching to allow the wafer to be reworked based on the inspection metrology results. Since the wafer can no longer be returned to a previous process state after etch, the wafer can be reprocessed to improve inspection results after development. It is thus important to obtain SEM images of the printed pattern of the wafer after development and before etching.

At step 206A, the system may acquire the wafer after it has been etched. At step 208A, the system may then acquire a SEM image of the etched wafer. Inspection of the wafer using the SEM image acquired at step 208A may be desired to observe etching effects on the wafer.

FIG. 2B illustrates a flowchart representing an exemplary method of wafer inspection. A wafer inspection process 200B, as shown in FIG. 2B, may be desirable. Similar to process 200A, at step 202B, an inspection system may acquire a developed wafer. Process 200B may then proceed to step 206B, where the system may acquire an etched wafer. At step 208B, the system may acquire a SEM image of the etched wafer. The potential damage to the wafer is avoided in wafer inspection process 200B since the process excludes acquiring a SEM image of the wafer after development.

In order to obtain a SEM image of the developed wafer in process 200B, a machine learning model may be used. Because the SEM inspection may not damage or affect the wafer after etching, the SEM image acquired at step 208B may be used to generate a predictive SEM image of the wafer after development.

Figure 3:
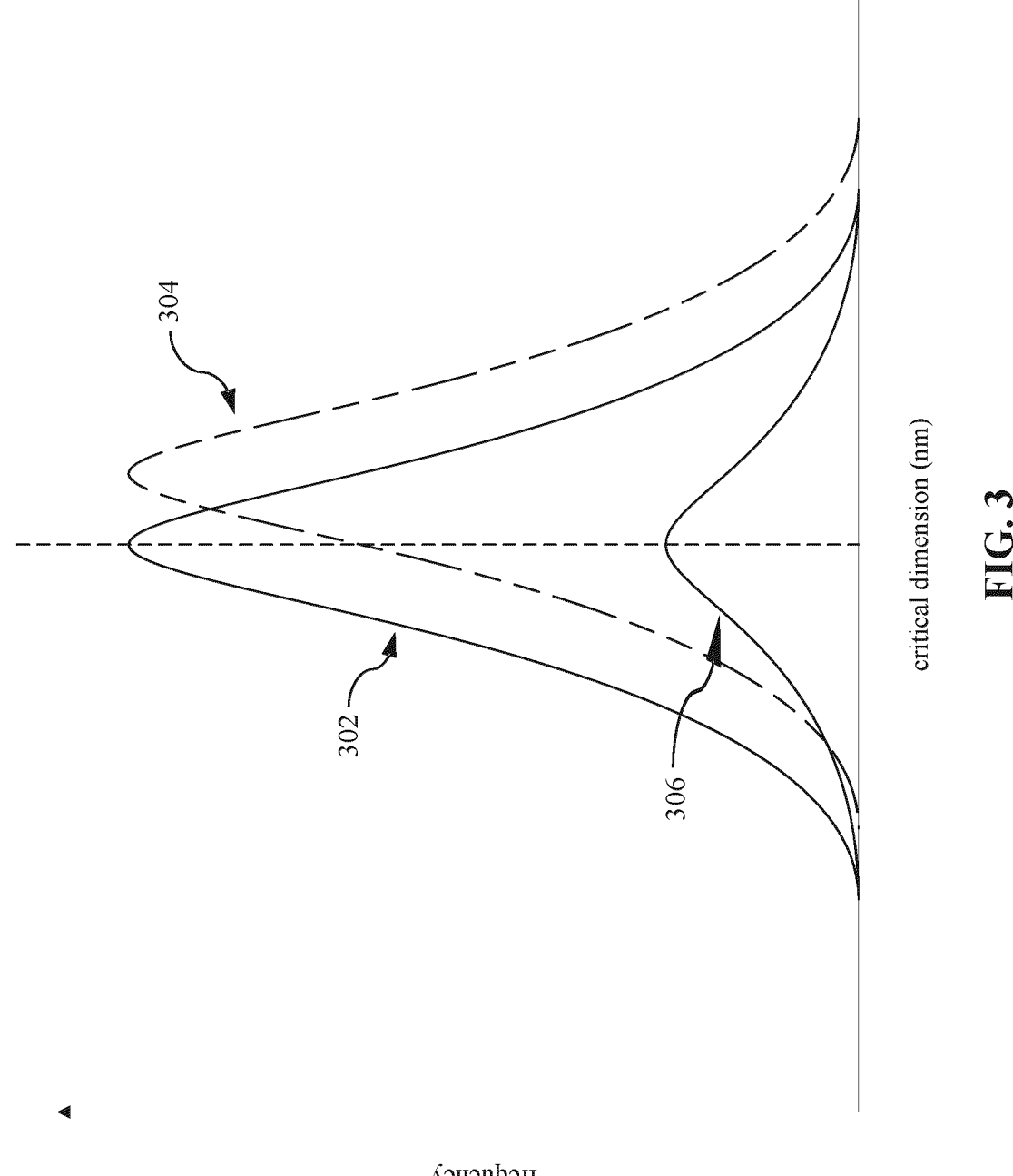
FIG. 3 is an exemplary distribution plot of critical dimensions acquired from SEM images, consistent with embodiments of the present disclosure.

FIG. 3 illustrates a distribution plot of critical dimensions acquired from SEM images of a wafer. Distribution 302 represents measurements of critical dimension of a wafer from a SEM image acquired after etching, but without any SEM inspection after development. Since SEM inspection of a wafer after etching may not affect the wafer, the measurements of distribution 302 are also representative of measurements of the undamaged wafer after development. Distribution 304 represents measurements of critical dimension of a wafer from a SEM image acquired after etching and after SEM inspection after development. Since SEM inspection of a wafer after development may affect and damage the wafer, the measurements of distribution 304 are also affected by SEM inspection of the wafer after development. As shown in FIG. 3, distribution 304 is shifted from distribution 302. Distribution 306 represents measurements of critical dimension of a wafer from SEM images sampled from distribution 304 in such a way that it replicated distribution 302. As shown in FIG. 3, distribution 306 has a smaller number of points than distribution 302, but the critical dimension of distributions 302 and 306 are identical. After-etch, SEM images from distribution 306 and their corresponding after-development pairs can be used to train the machine learning model. Thus, a machine learning model using a SEM image acquired after etching from distribution 306 may accurately generate a SEM image of a wafer after development without SEM-induced damage.

Figure 4:
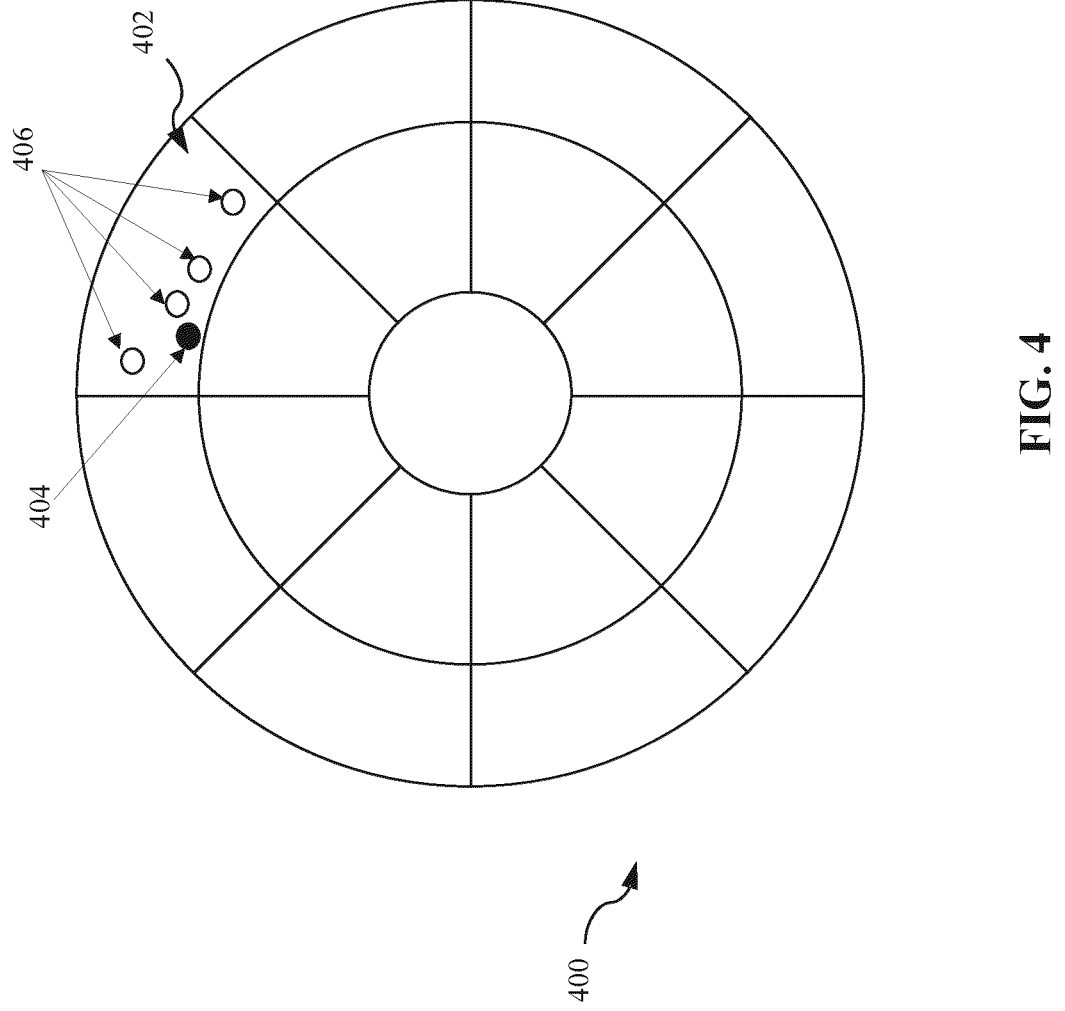
FIG. 4 is an exemplary depiction of a top view of a wafer with areas used for machine learning, consistent with embodiments of the present disclosure.

FIG. 4 illustrates a top view of a wafer 400, segmented to show points for wafer inspection. It should be noted that the lines and points on wafer 400 are used for illustrative purposes and are not physically part of the wafer. Wafer 400 may have clusters 402 (i.e., segments of the wafer) used for wafer inspection. For example, a SEM image of portion 404 may be acquired for a cluster after development of a photoresist applied to the wafer and after etching of the wafer. SEM images of different portions 406 may be acquired for the cluster after etching of the wafer. Since SEM inspection after development may damage the photoresist on the wafer, resulting in altered key performance indicators that are not reflective of the true key performance indicators of the wafer after development, a single after-development image may be acquired from portion 404. An after-etch image may also be acquired from portion 404 while only after-etch images may be acquired from portion 406. Advantageously, only one after-development image may be acquired from one cluster 402.

As explained above, the SEM images of portions 406 may be undamaged and used in a machine learning model to generate predictive SEM images of the wafer after development. SEM images of portion 404 (a first image acquired after development and a second image acquired after etching) may still be acquired to train the machine learning model. That is, process 200A (see FIG. 2A) may illustrate the process for acquiring SEM images for training the machine learning model while process 200B (see FIG. 2B) may illustrate the process for acquiring SEM images for applying the machine learning model. These processes may be implemented for at least some of clusters 402 of wafer 400 since each cluster 402 may be affected differently by wafer etching. Processes 200A and 200B may only be applied to cluster 402 in a radial direction since the effects of wafer etching on wafer 400 may differ only in the radial direction. Advantageously, only a small portion of the wafer may be damaged by SEM inspection after development since only one pair of training images, one after-development image and one after-etch image, are acquired for each cluster.

In another embodiment, the machine learning model may be conditioned to include parameters that characterize the wafer etching process (e.g., temperature, pressure, bias voltage, etc.). In this case, inputting etching parameters into the model accounts for the etch variability so that clustering may not be used. That is, only one after-development image and a corresponding after-etch image, may be acquired for training the model. Advantageously, an even smaller portion of the wafer may be damaged by SEM inspection after development since only one pair of training images are acquired for the entire wafer.

In another embodiment, a machine learning model that is trained (either for each cluster of a wafer or by conditioning to include parameters that characterize the wafer etching process) for a first wafer, as discussed above, may be applied to a second wafer. The second wafer may be imaged after etching and the after-etch SEM images may be used to generate predictive images of the second wafer after development by applying the machine learning model that was trained on the first wafer. Advantageously, the second wafer may not be damaged during inspection since no SEM inspection after development is required in this embodiment.

In some embodiments, a SEM image of portion 404 may be acquired for a cluster after development of a photoresist applied to the wafer and after etching of portion 404. SEM images of different portions 406 may be acquired for the cluster after development of the photoresist applied to the wafer. Since portions of the wafer can no longer be returned to a previous process state after etch, only portion 404 may be etched and a single after-etch image may be acquired from portion 404 so that the wafer can be re-processed to improve inspection results after etching. An after-development image may also be acquired from portion 404 while only after-development images may be acquired from portion 406. Advantageously, only one portion of cluster 402 may be etched and only one after-etch image may be acquired from one cluster 402.

As explained above, the SEM images of portions 406 may be unetched and used in a machine learning model to generate predictive SEM images of the wafer after etching. SEM images of portion 404 (a first image acquired after development and a second image acquired after etching) may still be acquired to train the machine learning model. That is, process 200A (see FIG. 2A) may illustrate the process for acquiring SEM images for training the machine learning model. This process may be implemented for at least some of clusters 402 of wafer 400 since each cluster 402 may be affected differently by wafer etching. Process 200A may only be applied to cluster 402 in a radial direction since the effects of wafer etching on wafer 400 may differ only in the radial direction. Advantageously, only a small portion of the wafer may be etched (e.g., may not be reworked) since only one pair of training images, one after-development image and one after-etch image, are acquired for each cluster.

In some embodiments, the machine learning model may be conditioned to include parameters that characterize the wafer etching process (e.g., temperature, pressure, bias voltage, etc.). In this case, inputting etching parameters into the model accounts for the etch variability so that clustering may not be used. That is, only one after-development image and a corresponding after-etch image, may be acquired for training the model. Advantageously, an even smaller portion of the wafer may be etched after development since only one pair of training images are acquired for the entire wafer.

In some embodiments, a machine learning model that is trained (either for each cluster of a wafer or by conditioning to include parameters that characterize the wafer etching process) for a first wafer, as discussed above, may be applied to a second wafer. In some embodiments, the machine learning model may be trained for the first wafer after the entire wafer is etched. The second wafer may be imaged after development of the photoresist applied to the wafer, and the after-development SEM images may be used to generate predictive images of the second wafer after etching by applying the machine learning model that was trained on the first wafer. Advantageously, the second wafer may be reworked before etching during inspection since no SEM inspection after etching is required in this embodiment.

Figure 5A:
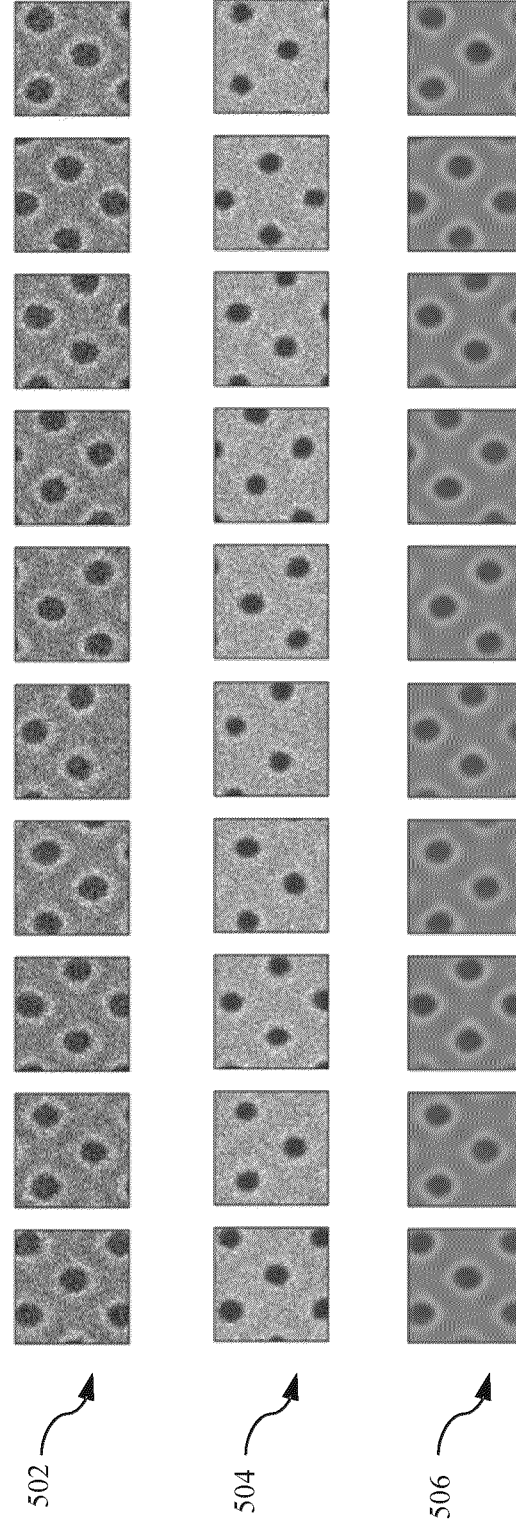
FIG. 5A depicts exemplary SEM images of a wafer, consistent with embodiments of the present disclosure.

FIG. 5A illustrates SEM images of a wafer. SEM images 502 (i.e., after-development images) depict through-holes on a wafer after development, but before etching. SEM images 504 depict through-holes of the wafer after etching. SEM images 504 are used in a trained machine learning model to generate SEM images 506, which are SEM images that predict through-holes on a wafer after development. Although not immediately apparent in FIG. 5A, the dimensions of the features in predictive SEM images 506 are substantially similar to the dimensions of the features in SEM images 502, but without the damage caused by SEM inspection after development.

Figure 5B:
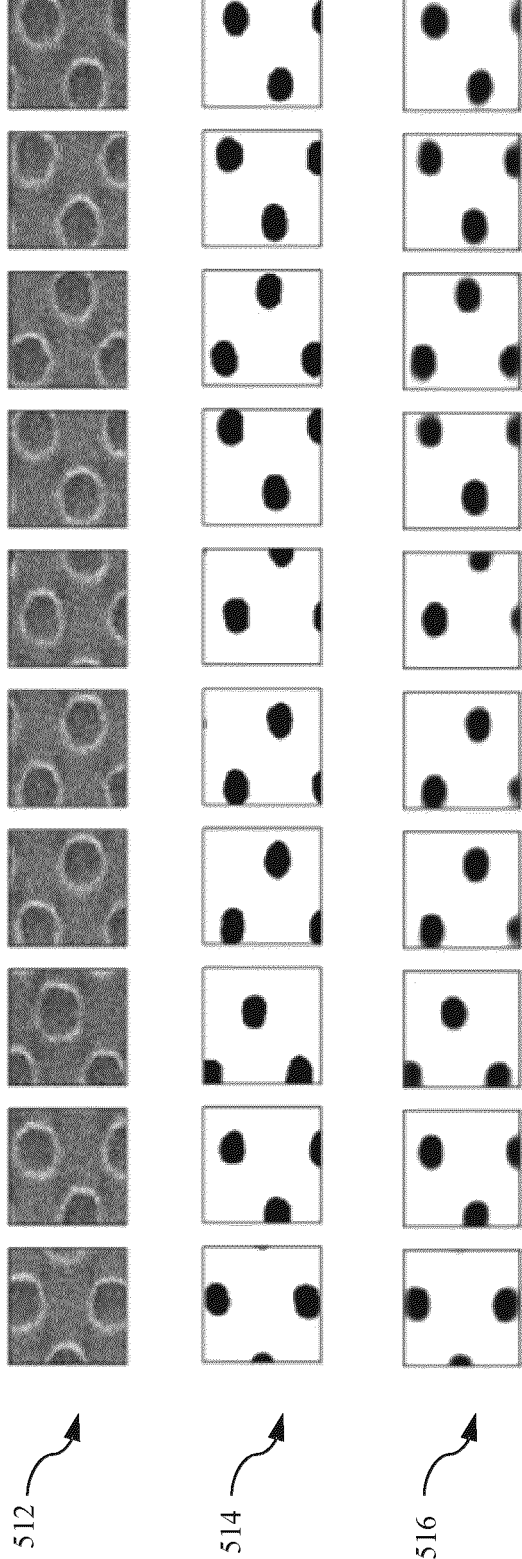
FIG. 5B depicts exemplary SEM images of a wafer, consistent with embodiments of the present disclosure.

FIG. 5B illustrates SEM images of a wafer. SEM images 512 (i.e., after-development images) depict through-holes on a photoresist layer on a wafer after development, but before etching. SEM images 514 depict through-holes of the layer on the wafer below the photoresist layer after etching. SEM images 512 are used in a trained machine learning model to generate binarized SEM images 516, which are SEM images that predict through-holes on a wafer after etching. The dimensions of the features in predictive SEM images 516 are substantially similar to the dimensions of the features in binarized SEM images 514, demonstrating that the trained machine learning model may be used to rework the wafer after development, but before etching.

Figure 6:
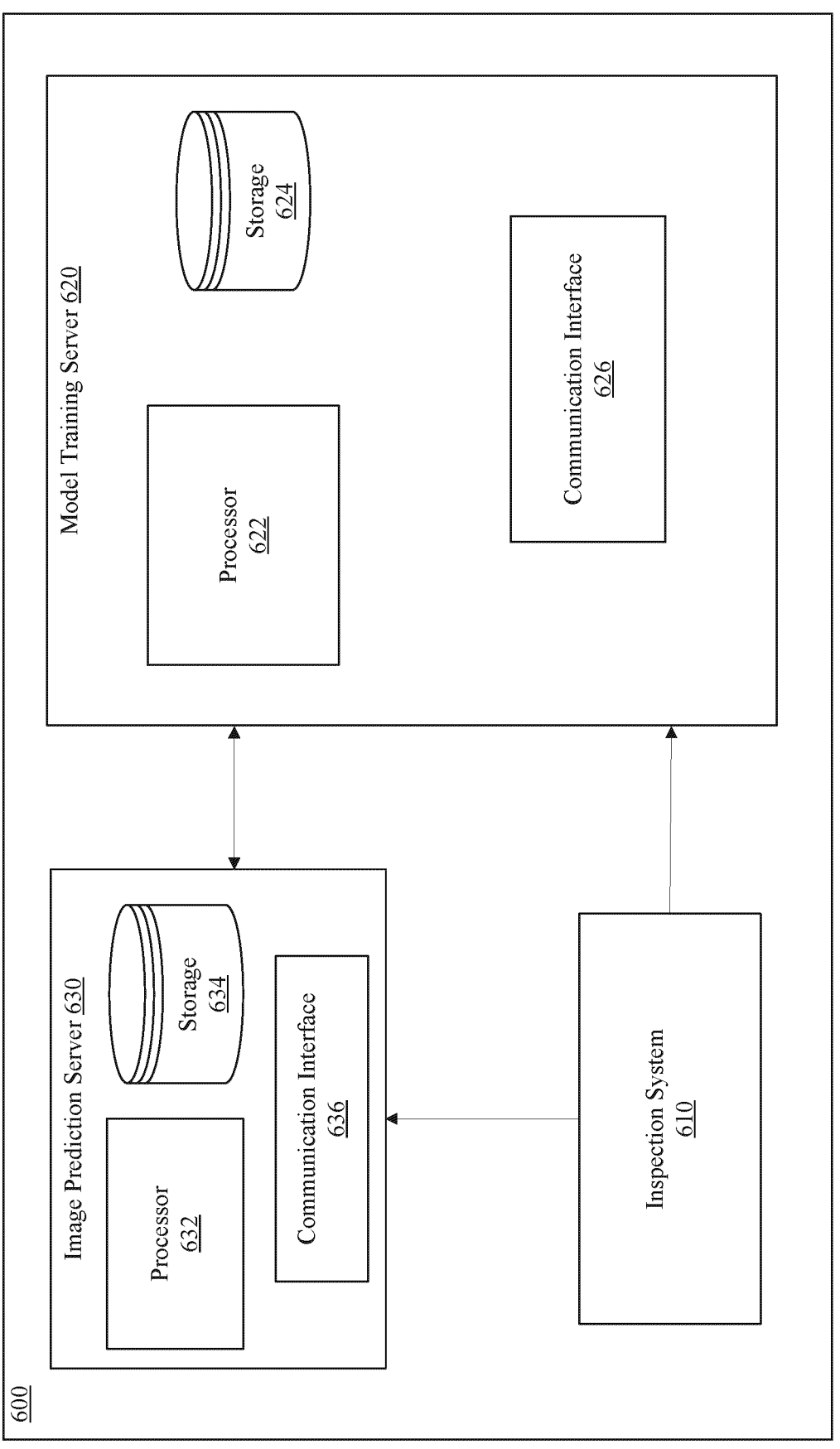
FIG. 6 is an exemplary system for generating predictive SEM images, consistent with embodiments of the present disclosure.

FIG. 6 illustrates a system 600 for generating predictive SEM images of a wafer (e.g., SEM images 506 of FIG. 5A, binarized SEM images 516 of FIG. 5B). System 600 may include a wafer inspection system 610, a model training server 620, and an image prediction server 630. System 610, model training server 620, and image prediction server 630 may be electrically coupled to each other, either physically (e.g., by a cable) or remotely. Wafer inspection system 610 may be the system described with respect to FIG. 1, used to acquire images of a wafer (see, e.g., wafer 150 of FIG. 1).

Model training server 620 may include a processor 622 and a storage 624. Model training server 620 may also include a communication interface 626 to receive wafer images from wafer inspection system 610. Processor 622 may be configured to analyze the received wafer images and transform the images into one or more feature maps that contain visual features of the wafer by applying a convolutional neural network (CNN). Processor 622 may also be configured to map visual features associated with a first wafer image to visual features associated with a second wafer image. Processor 622 may be configured to train a CNN encoder by using the mapping to construct the second wafer image from the first wafer image. Trained features of the wafer images may be extracted from the construction and inputted into a CNN decoder. Processor 622 may adjust weights of the CNN decoder by training the CNN decoder over the trained features of the wafer images. The training data may be stored in storage 624.

Image prediction server 630 may include a processor 632 and a storage 634. Image prediction server 630 may also include a communication interface 636 to receive wafer images from wafer inspection system 610. Processor 632 may be configured to analyze the received wafer images and transform the images into one or more feature maps that contain visual features of the wafer by applying a CNN. Processor 632 may also be configured to extract visual features associated with the wafer images using a CNN encoder, where the extraction includes using one or more convolutional pooling layers to learn hierarchical features from the wafer image. Processor 632 may identify the trained features used from the extracted visual features and input the trained features into a CNN decoder. Processor 632 may then generate predictive images corresponding to the wafer images received from wafer inspection system 610. The prediction data may be stored in storage 634. As discussed above, predictive images may be generated for a second wafer by applying a CNN that was trained on a first wafer.

Figure 7A:
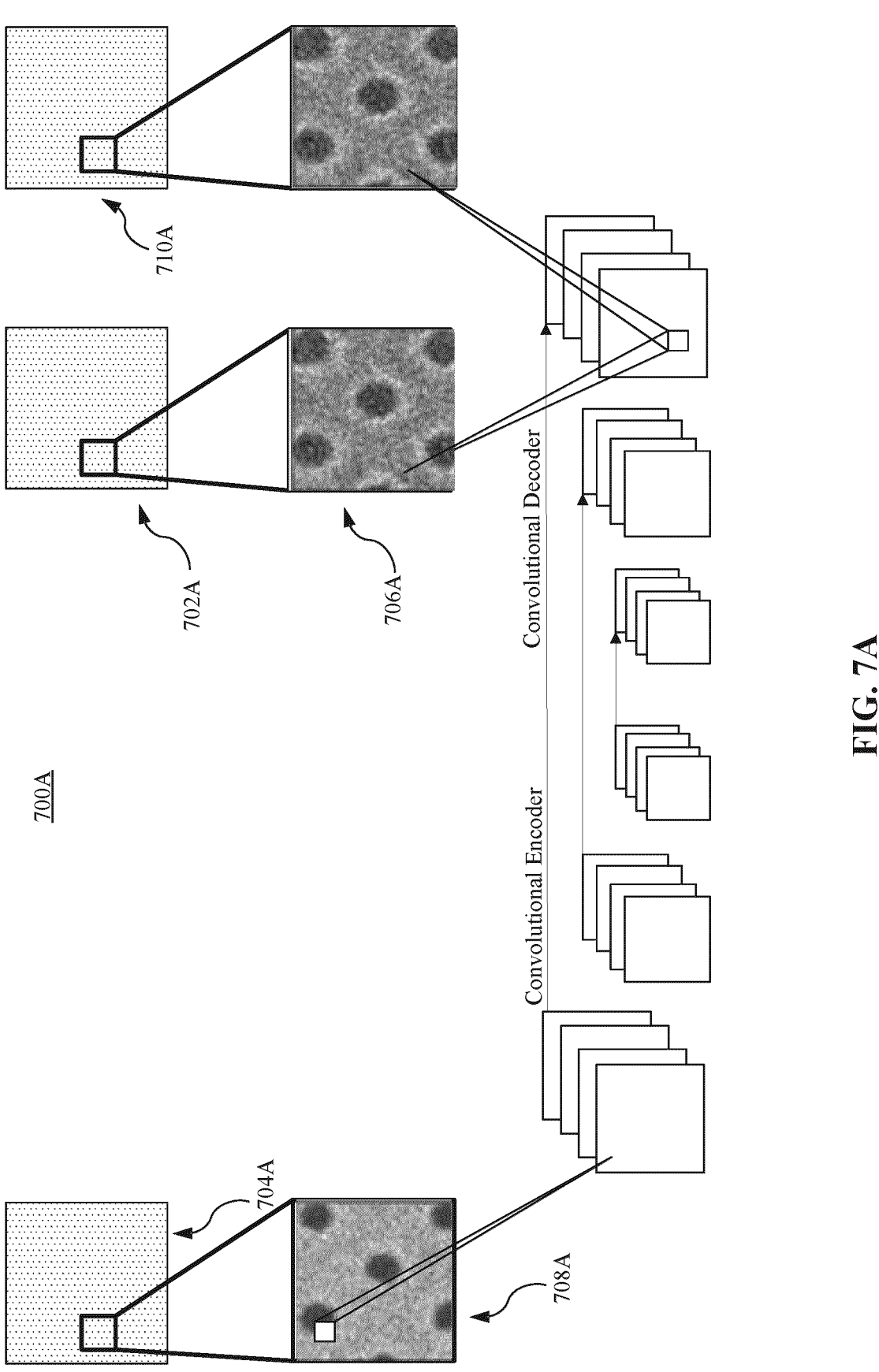
FIG. 7A is a schematic diagram illustrating an exemplary machine learning model training architecture, consistent with embodiments of the present disclosure.

FIG. 7A illustrates a schematic diagram of an exemplary machine learning model training architecture. The architecture may include a CNN 700A. CNN 700A may include an after-development image 702A of a portion of a wafer (e.g., wafer 150 of FIG. 1) and one or more after-etch images 704A of a segment of a wafer. The portion may be the entirety of a wafer and the segment may be the entirety of a wafer. While after-development image 702A may comprise a plurality of images 706A and after-etch image 704A may comprise a plurality of images 708A, the one or more after-etch images cover more of the wafer segment than the after-development images that only cover a portion of the segment. As stated above, the portion of the after-development wafer to be imaged may be minimized in an attempt to avoid potentially damaging the wafer.

CNN 700A may be trained by using after-development image 706A and after-etch image 708A. After-etch image 708A may be a first portion of the imaged segment of the wafer after etching, where the first portion corresponds to the imaged portion of the wafer of after-development image 706A. The training may include transforming after-development image 706A into one or more feature maps, which contain visual features of after-development image 706A. The training may also include transforming after-etch image 708A into one or more feature maps, which contain visual features of the imaged portion of the etched wafer. The visual features associated with after-etch image 708A may be mapped to the visual features associated with after-development image 706A.

Values of model parameters in each layer of CNN 700A of deep learning architecture may be learned from the mapping. Each label in each layer may represent an attribute of SEM input images. The CNN encoder may be trained using the mapping to construct after-development image 706A. The construction may output a reconstructed after-development image 710A. The trained features may be extracted from the construction and inputted into the CNN decoder, where the weights of the CNN decoder are adjusted by training the CNN decoder over the trained features. That is, the weights of the CNN decoder are adjusted so that the differences between after-development image 706A and reconstructed after-development image 710A are minimized. In some embodiments, CNN 700A may use a loss function that is learned during training (e.g., using a generative adversarial network). In some embodiments, other loss functions may be used (e.g., mean square error, quadratic loss, L2 loss, mean absolute error, L1 loss, mean bias error, etc.). In some embodiments, the trained features may include the effects of etching between the development process and the etching process of the wafer. The SEM noise may be averaged out during training since the noise is stochastic, resulting in a virtually or substantially noise-free prediction during application of the machine learning model.

Figure 7B:
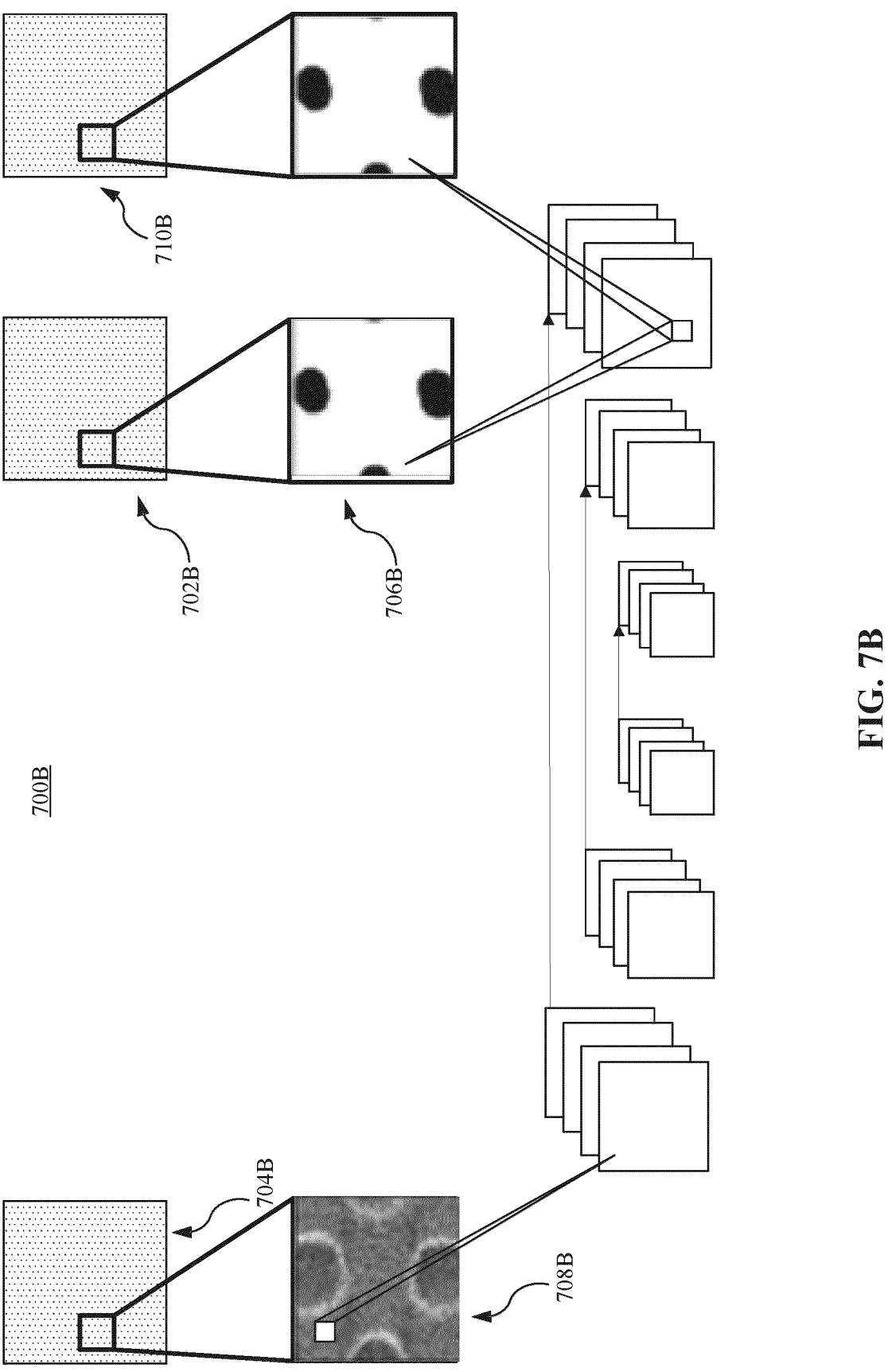
FIG. 7B is a schematic diagram illustrating an exemplary machine learning model training architecture, consistent with embodiments of the present disclosure.

FIG. 7B illustrates a schematic diagram of an exemplary machine learning model training architecture. The architecture may include a CNN 700B. CNN 700B may include an after-etch image 702B of a portion of a wafer (e.g., wafer 150 of FIG. 1) and one or more after-development images 704B of a segment of a wafer. The portion may be the entirety of a wafer, and the segment may be the entirety of a wafer. While after-etch image 702B may comprise a plurality of images 706B and after-development image 704B may comprise a plurality of images 708B, the one or more after-development images may cover more of the wafer segment than the after-etch images that only cover a portion of the segment. As stated above, the portion of the wafer to be etched and imaged after etching may be minimized in an attempt to rework the wafer before etching it entirely.

CNN 700B may be trained by using after-etch image 706B and after-development image 708B. After-development image 708B may be a first portion of the imaged segment of the wafer after development, where the first portion corresponds to the imaged portion of the wafer of after-etch image 706B. The training may include transforming after-etch image 706B into one or more feature maps, which contain visual features of after-etch image 706B. The training may also include transforming after-development image 708B into one or more feature maps, which contain visual features of the imaged portion of the developed wafer.

The visual features associated with after-development image 708B may be mapped to the visual features associated with after-etch image 706B.

Values of model parameters in each layer of CNN 700B may be learned from the mapping. Each label in each layer may represent an attribute of SEM input images. The CNN encoder may be trained using the mapping to construct after-etch image 706B. The construction may output a reconstructed after-etch image 710B. The trained features may be extracted from the construction and inputted into the CNN decoder, where the weights of the CNN decoder are adjusted by training the CNN decoder over the trained features. That is, the weights of the CNN decoder are adjusted so that the differences between after-etch image 706B and reconstructed after-etch 710B are minimized. In some embodiments, CNN 700B may use a loss function that is learned during training (e.g., using a generative adversarial network). In some embodiments, other loss functions may be used (e.g., mean square error, quadratic loss, L2 loss, mean absolute error, L1 loss, mean bias error, etc.). In some embodiments, the trained features may include the effects of etching between the development process and the etching process of the wafer. The SEM noise is averaged out during training since the noise is stochastic, resulting in a virtually noise-free prediction during application of the machine learning model.

In some embodiments, CNN 700B may be trained using a linear activation function in the output layer to output SEM images that provide greyscale values (e.g., images 506 of FIG. 5A). Greyscale SEM images may be desired to generate predictive images that emulate actual SEM images. In some embodiments, CNN 700B may be trained using a sigmoid activation function in the output layer to output binarized SEM images (e.g., images 516 of FIG. 5B). Binarized SEM images may be desired to generate predictive images that allow key performance indicators (e.g., critical dimensions) to be easily extracted from the generated predictive images. For example, the black portions of a generated predictive image may indicate that the model predicts a 100% likelihood that a contact hole exists in the corresponding portion of the wafer. The white portions of a generated predictive image may indicate that the model predicts a 100% likelihood that a contact hole does not exist in the corresponding portion of the wafer. Grey portions of a generated predictive image (e.g., edges of contact holes) may indicate that the model predicts a likelihood between 0-100% (e.g., the model is uncertain to a degree) that a contact hole exists in the corresponding portion of the wafer.

Figure 8A:
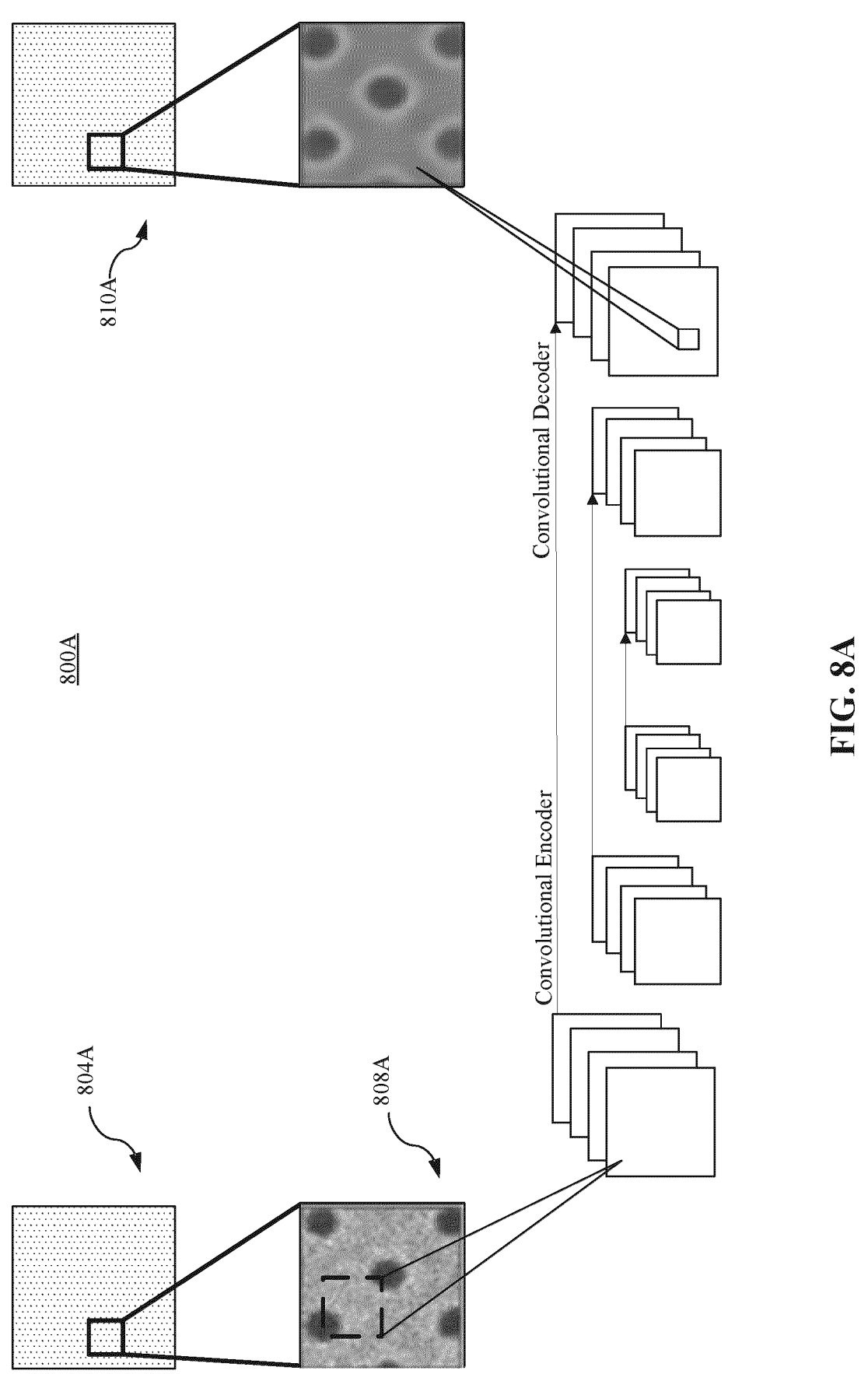
FIG. 8A is a schematic diagram illustrating an exemplary machine learning model application architecture, consistent with embodiments of the present disclosure.

FIG. 8A illustrates a schematic diagram of an exemplary machine learning model application architecture. The architecture may include a CNN 800A. CNN 800A may include a trained model (see, e.g., CNN 700A of FIG. 7A) and may include one or more after-etch images 804A of a segment of a wafer. After-etch image 808A may be a second portion of the imaged segment of the wafer, where the second portion is different from the first portion (see, e.g., first portion of after-etch image 708A of FIG. 7A).

The trained model may include a deep neural network topology with multiple layers. For example, architecture of such a network may comprise after-etch image 808A as an input, first convolution, first pooling, second convolution, second pooling, one or more hidden layers, activation, and output. Depending on the nature of features of defect patterns, each layer of the architecture may have different numbers of sub-samples generated. For example, after the first convolution operation, there may be less than ten sub-samples generated in first pool. While after the second convolution operation, the second layer may have more than ten sub-samples generated in second pool.

After the model parameters have been determined from the training using the imaged portion of the developed wafer and the corresponding imaged portion of the etched wafer, the trained network of deep learning architecture may process new images of other portions of the etched wafer. After-etch image 808A may pass through multiple layers of the trained network with the determined model parameters, to generate a feature vector at the end of the architecture. At each layer of convolution computing, after-etch image 808A may be analyzed for the architecture to determine if a trained feature exists, and if so, its geometric location. Each received image with trained features may be processed by calculations in a plurality of layers, layer by layer. Thus, a vector representation of an input image may be generated by the trained network.

Applying trained CNN 800A may include transforming second portion of after-etch image 808A into one or more feature maps by applying CNN 800A, wherein the one or more feature maps contain visual features of after-etch image 808A of second portion. After-etch image 808A as an input to network 800A may comprise a pattern image including identified features of the etched wafer. Application may also include extracting the visual features associated with after-etch image 808A of second portion using the CNN encoder, where the extraction comprises using one or more convolutional pooling layers to learn hierarchical features from after-etch image 808A. Application may also include identifying trained features using the extracted visual features. The trained features of after-etch image 808A may be labelled automatically.

Application of the trained model may also include inputting the trained features into a CNN decoder and generating predictive wafer image 810A, where predictive image 810A includes other portions of the segment of the developed wafer prior to etching. As discussed above, predictive images may be generated for a second wafer by applying a CNN (e.g., FIG. 8A) that was trained on a first wafer (see, e.g., FIG. 7A).

In some embodiments, a statistical analysis (see, e.g., FIG. 3) may be performed based on the after-etch images, the after-development images, and predictive images to generate a statistical characterization of SEM damage to the wafer.

In some embodiments, CNN 800A may use a linear activation function in the output layer to output SEM images that provide greyscale values (e.g., images 506 of FIG. 5A). Greyscale SEM images may be desired to generate predictive images that emulate actual SEM images.

Figure 8B:
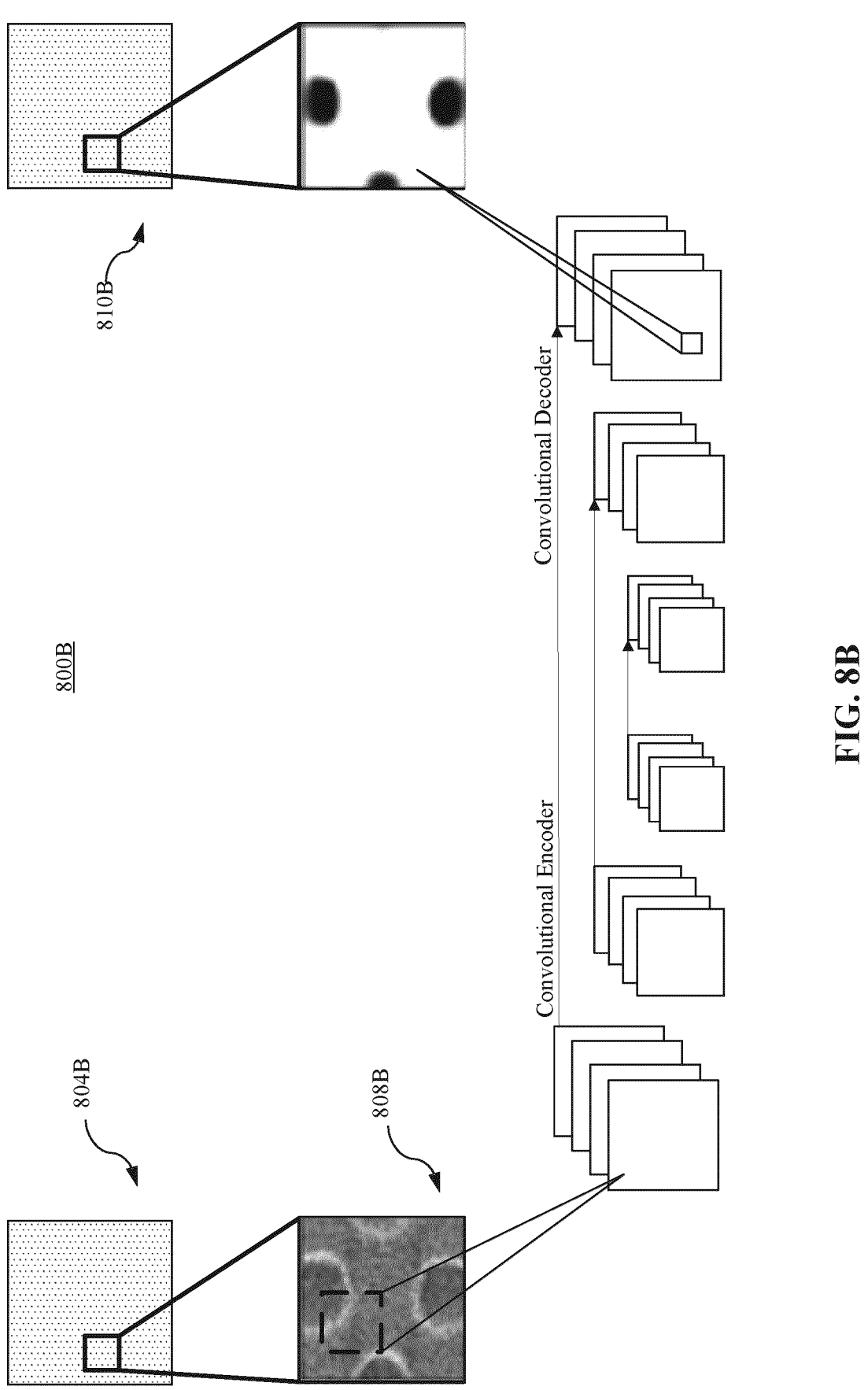
FIG. 8B is a schematic diagram illustrating an exemplary machine learning model application architecture, consistent with embodiments of the present disclosure.

FIG. 8B illustrates a schematic diagram of an exemplary machine learning model application architecture. The architecture may include a CNN 800B. CNN 800B may include a trained model (see, e.g., CNN 700B of FIG. 7B) and may include one or more after-development images 804B of a segment of a wafer. After-development image 808B may be a second portion of the imaged segment of the wafer, where the second portion is different from the first portion (see, e.g., first portion of after-development image 708B of FIG. 7B).

The trained model may include a deep neural network topology with multiple layers. For example, an architecture of such a network may comprise after-development image 808B (as an input), first convolution, first pooling, second convolution, second pooling, one or more hidden layers, activation, and output. Depending on the nature of features of defect patterns, each layer of the architecture may have different numbers of sub-samples generated. For example, after the first convolution operation, there may be less than ten sub-samples generated in a first pool. While after the second convolution operation, the second layer may have more than ten sub-samples generated in a second pool.

After the model parameters have been determined from the training using the imaged portion of the developed wafer and the corresponding imaged portion of the etched wafer, the trained network of deep learning architecture may process new images of other portions of the developed wafer or another wafer. After-development image 808B may pass through multiple layers of the trained network with the determined model parameters, to generate a feature vector at the end of the architecture. At each layer of convolution computing, after-development image 808B may be analyzed by the architecture to determine if a trained feature exists, and if so, its geometric location. Each received image with trained features may be processed by calculations in a plurality of layers, layer by layer. Thus, a vector representation of an input image may be generated by the trained network.

Applying trained CNN 800B may include transforming a second portion of after-development image 808B into one or more feature maps by applying CNN 800B, wherein the one or more feature maps contain visual features of after-development image of second portion 808B. After-development image 808B as an input to network 800B may comprise a pattern image including identified features of the developed wafer. Application may also include extracting the visual features associated with after-development image of second portion 808B using the CNN encoder, where the extraction comprises using one or more convolutional pooling layers to learn hierarchical features from after-development image 808B. Application may also include identifying trained features using the extracted visual features. The trained features of after-development image 808B may be labelled automatically.

Application of the trained model may also include inputting the trained features into a CNN decoder and generating predictive wafer image 810B, where predictive image 810B includes other portions of the segment of the wafer after etching. As discussed above, predictive images may be generated for a second wafer by applying a CNN (e.g., FIG. 8B) that was trained on a first wafer (see, e.g., FIG. 7B).

In some embodiments, a statistical analysis (see, e.g., FIG. 3) may be performed based on the after-etch images, the after-development images, and predictive images to generate a statistical characterization of SEM damage to the wafer.

In some embodiments, CNN 800B may use a sigmoid activation function in the output layer to output binarized SEM images (e.g., images 516 of FIG. 5B). Binarized SEM images may be desired to generate predictive images that allow key performance indicators (e.g., critical dimensions) to be easily extracted from the generated predictive images. For example, the black portions of a generated predictive image may indicate that the model predicts a 100% likelihood that a contact hole exists in the corresponding portion of the wafer. The white portions of a generated predictive image may indicate that the model predicts a 100% likelihood that a contact hole does not exist in the corresponding portion of the wafer. Grey portions of a generated predictive image (e.g., edges of contact holes) may indicate that the model predicts a likelihood between 0-100% (e.g., the model is uncertain to a degree) that a contact hole exists in the corresponding portion of the wafer.

Figure 9A:
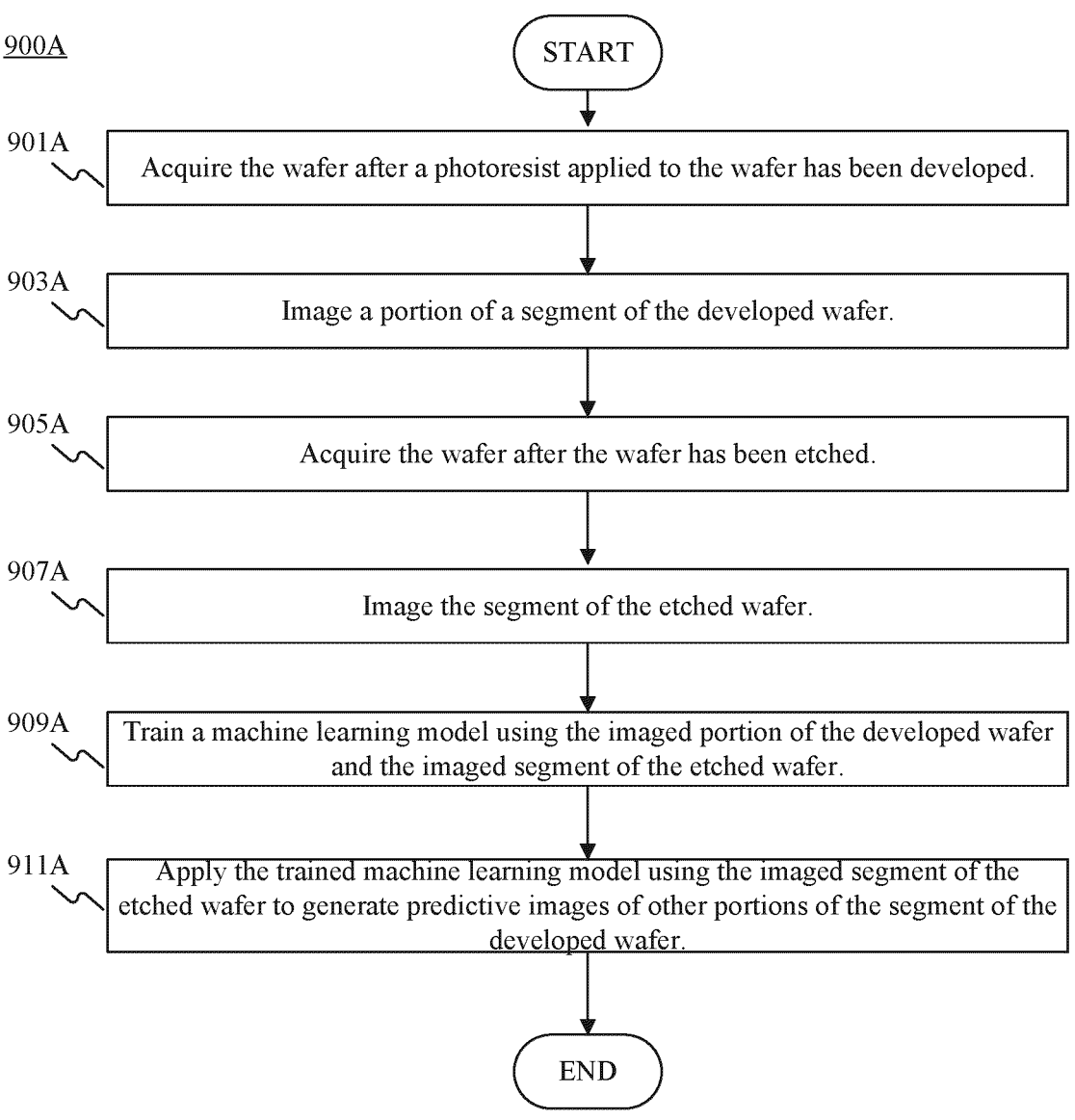
FIG. 9A is a flowchart representing an exemplary method of wafer inspection, consistent with embodiments of the present disclosure.

FIG. 9A illustrates a flowchart representing an exemplary method of wafer inspection 900A, consistent with embodiments of the present disclosure. Method 900A may be performed by a system (e.g., system 600 of FIG. 6). The system may include an inspection system (e.g., inspection system 610 of FIG. 6) that performs one or more steps of method 900A. For example, the inspection system may use an electron beam tool (e.g., electron beam tool 104 of FIG. 1) to image different areas of a wafer (e.g., wafer 150 of FIG. 1).

In step 901A, a system (e.g., system 600 of FIG. 6) may acquire a wafer after a photoresist applied to the wafer has been developed.

In step 903A, the system may image a portion of a segment of the developed wafer (see, e.g., portion 404 of FIG. 4) using an image acquirer (e.g., image acquirer 200 of FIG. 1). The portion may be the entirety of the segment. The image acquirer may receive a signal from a detector of an electron beam tool (e.g., detector 144 of FIG. 1) and construct an image, thereby acquiring images of a portion of a segment of the developed wafer (e.g., wafer 150 of FIG. 1). The portion of the after-development wafer to be imaged may be minimized in an attempt to avoid potentially damaging the wafer. Examples of after-development images are provided at images 502 of FIG. 5A.

In step 905A, the system (e.g., system 600 of FIG. 6) may acquire the wafer after the wafer has been etched.

In step 907A, the system may image the segment of the etched wafer corresponding to the imaged portion of the developed wafer (see, e.g., 402 of FIG. 4) using an image acquirer (e.g., image acquirer 200 of FIG. 1). The image acquirer may receive a signal from a detector of an electron beam tool (e.g., detector 144 of FIG. 1) and construct an image, thereby acquiring images of the segment of the etched wafer (e.g., wafer 150 of FIG. 1). Examples of after-etch images are provided at images 504 of FIG. 5A. The after-etch images cover more of the wafer segment than the after-development images that only cover a portion of the segment to minimize potential damage to the wafer. As stated above, the after-development images are only used to train a machine learning model while the after-etch images are used to both train the machine learning model and to generate predictive images of the after-development wafer.

In step 909A, the system may train a machine learning model using the imaged portion of the developed wafer and the imaged segment of the etched wafer. The system including an inspection system may also include a model training server (e.g., model training server 620 of FIG. 6). The model training server may include a processor (e.g., processor 622 of FIG. 6), a storage (e.g., storage 624 of FIG. 6), and a communication interface (e.g., communication interface 626 of FIG. 6) to receive wafer images from the inspection system (e.g., inspection system 610 of FIG. 6). The processor may be configured to analyze the received wafer images and transform the images into one or more feature maps that contain visual features of the wafer by applying a CNN (e.g., CNN 700A of FIG. 7A). The processor may also be configured to map visual features associated with the after-etch image to visual features associated with the after-development image. The processor may be configured to train a CNN encoder by using the mapping to construct the after-development image from the after-etch image. Trained features of the wafer images may be extracted from the construction and inputted into a CNN decoder. The processor may adjust weights of the CNN decoder by training the CNN decoder over the trained features of the wafer images. That is, the weights of the CNN decoder are adjusted so that the differences between the after-development image and the constructed after-development image are minimized. The training data may be stored in the storage.

In step 911A, the system may apply the trained machine learning model using the imaged segment of the etched wafer to generate predictive images of other portions (see, e.g., portion 406 of FIG. 4) of the segment of the developed wafer or images of other wafers. The system including an inspection system and a model training server may also include an image prediction server (e.g., image prediction server 630 of FIG. 6). The inspection system, model training server, and image prediction server may be electrically coupled to each other, either physically (e.g., by a cable) or remotely. The image prediction server may include a processor (e.g., processor 632 of FIG. 6), a storage (e.g., storage 634 of FIG. 6), and a communication interface (e.g., communication interface 636 of FIG. 6) to receive wafer images from the inspection system (e.g., inspection system 610 of FIG. 6). The processor may be configured to analyze the received wafer images and transform the images into one or more feature maps that contain visual features of the wafer by applying a CNN (e.g., CNN 800A of FIG. 8A). The processor may also be configured to use a CNN encoder to extract visual features associated with the after-etch images, which are different from the after-etch images used for training. The extraction includes using one or more convolutional pooling layers to learn hierarchical features from the after-etch image. The processor may identify the trained features used from the extracted visual features and input the trained features into a CNN decoder. The processor may then generate predictive images of the after-development wafer corresponding to the after-etch images received from the inspection system. The prediction data may be stored in the storage. Examples of predictive images are provided at images 506 of FIG. 5A.

Figure 9B:
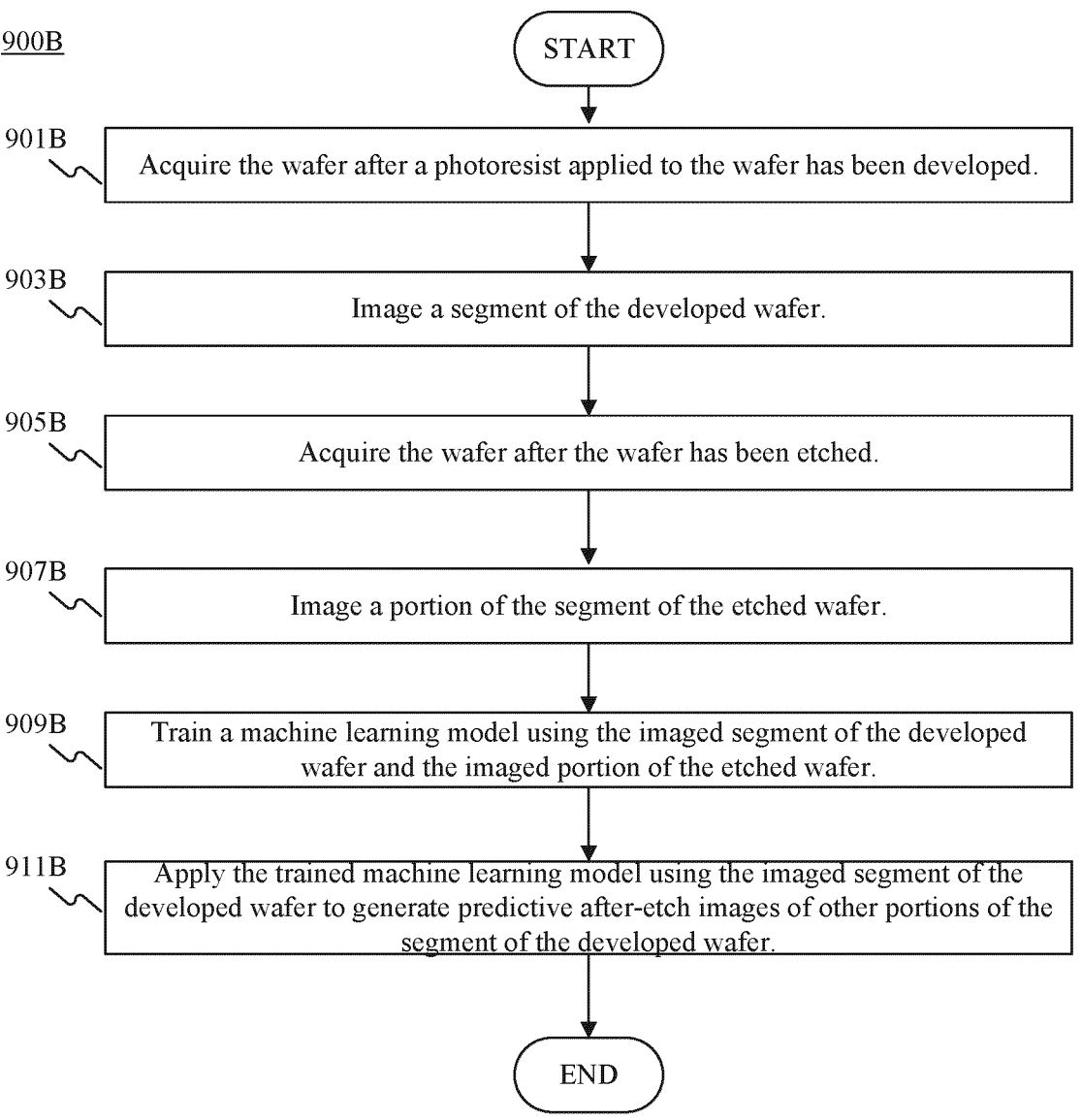
FIG. 9B is a flowchart representing an exemplary method of wafer inspection, consistent with embodiments of the present disclosure.

FIG. 9B illustrates a flowchart representing an exemplary method of wafer inspection 900B, consistent with embodiments of the present disclosure. Method 900B may be performed by a system (e.g., system 600 of FIG. 6). The system may include an inspection system (e.g., inspection system 610 of FIG. 6) that performs one or more steps of method 900B. For example, the inspection system may use an electron beam tool (e.g., electron beam tool 104 of FIG. 1) to image different areas of a wafer (e.g., wafer 150 of FIG. 1).

In step 901B, a system (e.g., system 600 of FIG. 6) may acquire a wafer after a photoresist applied to the wafer has been developed.

In step 903B, the system may image a segment of the developed wafer (see, e.g., 402 of FIG. 4) using an image acquirer (e.g., image acquirer 200 of FIG. 1). The segment may be a portion of or the entire developed wafer. The image acquirer may receive a signal from a detector of an electron beam tool (e.g., detector 144 of FIG. 1) and construct an image, thereby acquiring images of a segment or the entirety of the developed wafer (e.g., wafer 150 of FIG. 1). Examples of after-development images are provided at images 512 of FIG. 5B.

In step 905B, the system (e.g., system 600 of FIG. 6) may acquire the wafer after the wafer has been etched.

In step 907B, the system may image a portion of the segment of the etched wafer corresponding to the imaged segment of the developed wafer (see, e.g., portion 404 of FIG. 4) using an image acquirer (e.g., image acquirer 200 of FIG. 1). The portion of the segment may be the entire segment. The image acquirer may receive a signal from a detector of an electron beam tool (e.g., detector 144 of FIG.

1) and construct an image, thereby acquiring images of a portion of the segment of the etched wafer (e.g., wafer 150 of FIG. 1). Examples of after-etch images are provided at images 514 of FIG. 5B. The portion of the wafer etched and the portion of the after-etch wafer to be imaged may be minimized in an attempt to allow reworking of the wafer before etching. As stated above, the after-development images are used to both train the machine learning model and to generate predictive images of the after-etch wafer while the after-etch images are only used to train a machine learning model.

In step 909B, the system may train a machine learning model using the imaged portion of the etched wafer and the imaged segment of the developed wafer. The system including an inspection system may also include a model training server (e.g., model training server 620 of FIG. 6). The model training server may include a processor (e.g., processor 622 of FIG. 6), a storage (e.g., storage 624 of FIG. 6), and a communication interface (e.g., communication interface 626 of FIG. 6) to receive wafer images from the inspection system (e.g., inspection system 610 of FIG. 6). The processor may be configured to analyze the received wafer images and transform the images into one or more feature maps that contain visual features of the wafer by applying a CNN (e.g., CNN 700B of FIG. 7B). The processor may also be configured to map visual features associated with the after-development image to visual features associated with the after-etch image. The processor may be configured to train a CNN encoder by using the mapping to construct the after-etch image from the after-development image. Trained features of the wafer images may be extracted from the construction and inputted into a CNN decoder. The processor may adjust weights of the CNN decoder by training the CNN decoder over the trained features of the wafer images. That is, the weights of the CNN decoder are adjusted so that the differences between the after-etch image and the constructed after-etch image are minimized. The training data may be stored in the storage.

In step 911B, the system may apply the trained machine learning model using the imaged segment of the developed wafer to generate predictive after-etch images of other portions (see, e.g., portion 406 of FIG. 4) of the segment of the developed wafer or images of other wafers. The system including an inspection system and a model training server may also include an image prediction server (e.g., image prediction server 630 of FIG. 6). The inspection system, model training server, and image prediction server may be electrically coupled to each other, either physically (e.g., by a cable) or wirelessly. The image prediction server may include a processor (e.g., processor 632 of FIG. 6), a storage (e.g., storage 634 of FIG. 6), and a communication interface (e.g., communication interface 636 of FIG. 6) to receive wafer images from the inspection system (e.g., inspection system 610 of FIG. 6). The processor may be configured to analyze the received wafer images and transform the images into one or more feature maps that contain visual features of the wafer by applying a CNN (e.g., CNN 800B of FIG. 8B). The processor may also be configured to use a CNN encoder to extract visual features associated with the after-development images, which are different from the after-development images used for training. The extraction includes using one or more convolutional pooling layers to learn hierarchical features from the after-development image. The processor may identify the trained features used from the extracted visual features and input the trained features into a CNN decoder. The processor may then generate predictive after-etch images of the wafer corresponding to the after-development images received from the inspection system. The prediction data may be stored in the storage. Examples of predictive images are provided at images 516 of FIG. 5B.

FIG. 10 illustrates a flowchart representing an exemplary method of wafer inspection 1000, consistent with embodiments of the present disclosure. Method 1000 may be performed by a system (e.g., system 600 of FIG. 6). The system may include an inspection system (e.g., inspection system 610 of FIG. 6) that performs one or more steps of method 1000. For example, the inspection system may use an electron beam tool (e.g., electron beam tool 104 of FIG. 1) to image different areas of a wafer (e.g., wafer 150 of FIG. 1).

In step 1001, a system (e.g., system 600 of FIG. 6) may obtain a first set of images of features of the wafer after the photoresist layer has been developed. The system may image a portion of a segment of the developed wafer (see, e.g., portion 404 of FIG. 4) using an image acquirer (e.g., image acquirer 200 of FIG. 1). The image acquirer may receive a signal from a detector of an electron beam tool (e.g., detector 144 of FIG. 1) and construct an image, thereby acquiring images of a portion of a segment of the developed wafer (e.g., wafer 150 of FIG. 1). The portion of the after-development wafer to be imaged is minimized in an attempt to avoid potentially damaging the wafer. Examples of after-development images are provided at images 502 of FIG. 5.

In step 1003, the system (e.g., system 600 of FIG. 6) may obtain a second set of images of features of the wafer after the wafer has been etched. The system may image the segment of the etched wafer corresponding to the imaged portion of the developed wafer (see, e.g., 402 of FIG. 4) using an image acquirer (e.g., image acquirer 200 of FIG. 1). The image acquirer may receive a signal from a detector of an electron beam tool (e.g., detector 144 of FIG. 1) and construct an image, thereby acquiring images of the segment of the etched wafer (e.g., wafer 150 of FIG. 1). Examples of after-etch images are provided at images 504 of FIG. 5. The after-etch images cover more of the wafer segment than the after-development images that only cover a portion of the segment to minimize potential damage to the wafer. As stated above, the after-development images are only used to train a machine learning model while the after-etch images are used to both train the machine learning model and to generate predictive images of the after-development wafer.

In step 1005, the system may train a machine learning model using the first and second sets of images. The system including an inspection system may also include a model training server (e.g., model training server 620 of FIG. 6). The model training server may include a processor (e.g., processor 622 of FIG. 6), a storage (e.g., storage 624 of FIG. 6), and a communication interface (e.g., communication interface 626 of FIG. 6) to receive wafer images from the inspection system (e.g., inspection system 610 of FIG. 6). The processor may be configured to analyze the received wafer images and transform the images into one or more feature maps that contain visual features of the wafer by applying a CNN (e.g., CNN 700A of FIG. 7A). The processor may also be configured to map visual features associated with the after-etch image to visual features associated with the after-development image. The processor may be configured to train a CNN encoder by using the mapping to construct the after-development image from the after-etch image. Trained features of the wafer images may be extracted from the construction and inputted into a CNN decoder. The processor may adjust weights of the CNN decoder by training the CNN decoder over the trained features of the wafer images. That is, the weights of the CNN decoder are adjusted so that the differences between the after-development image and the constructed after-development image are minimized. The training data may be stored in the storage.

In step 1007, the system may generate a third set of images of approximate features that is based on photoresist layer application to the wafer, where the approximated features exclude damage induced by SEM imaging after development of the photoresist layer. The system may apply the trained machine learning model using the imaged segment of the etched wafer to generate predictive images of other portions (see, e.g., portion 406 of FIG. 4) of the segment of the developed wafer. The system including an inspection system and a model training server may also include an image prediction server (e.g., image prediction server 630 of FIG. 6). The inspection system, model training server, and image prediction server may be electrically coupled to each other, either physically (e.g., by a cable) or remotely. The image prediction server may include a processor (e.g., processor 632 of FIG. 6), a storage (e.g., storage 634 of FIG. 6), and a communication interface (e.g., communication interface 636 of FIG. 6) to receive wafer images from the inspection system (e.g., inspection system 610 of FIG. 6). The processor may be configured to analyze the received wafer images and transform the images into one or more feature maps that contain visual features of the wafer by applying a CNN (e.g., CNN 800A of FIG. 8A). The processor may also be configured to use a CNN encoder to extract visual features associated with the after-etch images, which are different from the after-etch images used for training. The extraction includes using one or more convolutional pooling layers to learn hierarchical features from the after-etch image. The processor may identify the trained features used from the extracted visual features and input the trained features into a CNN decoder. The processor may then generate predictive images of the after-development wafer corresponding to the after-etch images received from the inspection system. The prediction data may be stored in the storage. Examples of predictive images are provided at images 506 of FIG. 5.

In step 1009, the system may perform a statistical analysis based on the first, second, and third sets of images to generate a statistical characterization of SEM damage to the wafer. A system (e.g., system 600 of FIG. 6) may perform the statistical analysis by measuring features of the wafer from the first, second, and third sets of images. An example of a statistical analysis is provided by the distribution plots of FIG. 3. For example, a statistical analysis may include a distribution plot of critical dimensions acquired from SEM images of a wafer. A first distribution (e.g., distribution 302 of FIG. 3) may represent measurements of critical dimension of a wafer from a SEM image acquired after etching, but without any SEM inspection after development. Since SEM inspection of a wafer after etching may not affect the wafer, the measurements of the first distribution are also representative of measurements of the undamaged wafer after development. A second distribution (e.g., distribution 304 of FIG. 3) may represent measurements of critical dimension of a wafer from a SEM image acquired after etching and after SEM inspection after development. Since SEM inspection of a wafer after development may affect and damage the wafer, the measurements of second distribution are also affected by SEM inspection of the wafer after development. The second distribution may be shifted from the first distribution. A third distribution (e.g., distribution 306 of FIG. 3) may represent measurements of critical dimension of a wafer from SEM images sampled from the second distribution in such a way that it replicates the first distribution. The third distribution may have a smaller number of points than the first distribution, but the critical dimension of the first and third distributions may be identical. After-etch SEM images from the third distribution and their corresponding after-development pairs can be used to train the machine learning model. Thus, a machine learning model using a SEM image acquired after etching from the third distribution may accurately generate a SEM image of a wafer after development without SEM-induced damage.

The embodiments may further be described using the following clauses:

1. A method for inspecting a wafer, comprising:
   acquiring the wafer after a photoresist applied to the wafer has been developed;
   imaging a portion of a segment of the developed wafer;
   acquiring the wafer after the wafer has been etched;
   imaging the segment of the etched wafer; and
   training a machine learning model using the imaged portion of the developed wafer and the imaged segment of the etched wafer.

2. The method of clause 1, wherein the imaged segment of the etched wafer comprises a plurality of images.

3. The method of any one of clauses 1 or 2, wherein the imaged portion of the developed wafer comprises a plurality of images.

4. The method of any one of clauses 1-3, wherein training the machine learning model comprises:
   transforming the imaged segment of the etched wafer into one or more feature maps by applying a convolutional neural network (CNN), wherein the one or more feature maps contain visual features of the imaged segment of the etched wafer;
   transforming the imaged portion of the developed wafer into one or more feature maps by applying the CNN, wherein the one or more feature maps contain visual features of the imaged portion of the developed wafer;
   mapping the visual features associated with the imaged segment of the etched wafer to the visual features associated with the imaged portion of the developed wafer;
   training a CNN encoder, using the mapping, to construct the imaged portion of the developed wafer from the imaged segment of the etched wafer;
   extracting trained features from the construction,
   inputting the trained features into a CNN decoder; and
   adjusting weights of the CNN decoder by training the CNN decoder over the trained features.

5. The method of clause 4, wherein mapping the visual features comprises mapping the visual features associated with the imaged portion of the developed wafer to the visual features associated with a first portion of the imaged segment of the etched wafer.

6. The method of clause 5, wherein the imaged portion of the developed wafer corresponds to the first portion of the imaged segment of the etched wafer.

7. The method of any one of clauses 1-6, wherein applying the trained machine learning model comprises using a second portion of the imaged segment of the etched wafer.

8. The method of clause 7, wherein the first portion of the imaged segment of the etched wafer is different from the second portion of the imaged segment of the etched wafer.

9. The method of any one of clauses 1-8, wherein applying the trained machine learning model comprises:
   transforming the imaged segment of the etched wafer into one or more feature maps by applying a convolutional neural network (CNN), wherein the one or more feature maps contain visual features of the imaged segment of the etched wafer;

extracting the visual features associated with the imaged segment of the etched wafer using a CNN encoder, wherein the extraction comprises using one or more convolutional pooling layers to learn hierarchical features from the imaged segment of the etched wafer;

identifying trained features using the extracted visual features;

inputting the trained features into a CNN decoder; and generating predictive images of other portions of the segment of the developed wafer.

10. The method any one of clauses 1-9, wherein the machine learning model comprises a plurality of machine learning models.

11. The method of clause 10, wherein each machine learning model corresponds to a different segment of the wafer.

12. The method of any one of clauses 1-9, wherein applying the trained machine learning model comprises one machine learning model and inputting etching parameters that characterize etching of the wafer.

13. The method of any one of clauses 1-9, wherein applying the trained machine learning model comprises using the imaged segment of the etched wafer to generate predictive images of other portions of the segment of the developed wafer.

14. The method of any one of clauses 1-6, wherein the wafer is a first wafer.

15. The method of clause 14, comprising:

acquiring a second wafer after the second wafer has been etched;

imaging a segment of the etched second wafer; and applying the trained machine learning model using the imaged segment of the second etched wafer to generate predictive images of the segment of the second wafer after a photoresist applied to the second wafer has been developed.

16. The method of any one of clauses 14 or 15, wherein applying the trained machine learning model comprises:

transforming the imaged segment of the etched second wafer into one or more feature maps by applying a convolutional neural network (CNN), wherein the one or more feature maps contain visual features of the imaged segment of the etched second wafer;

extracting the visual features associated with the imaged segment of the etched second wafer using a CNN encoder, wherein the extraction comprises using one or more convolutional pooling layers to learn hierarchical features from the imaged segment of the etched second wafer;

identifying trained features using the extracted visual features;

inputting the trained features into a CNN decoder; and generating predictive images of the segment of the developed second wafer.

17. A method for training a machine learning model, the method comprising inputting, into the machine learning model, a first set of images of a portion of a segment of a wafer after a photoresist applied to the wafer has been developed;

inputting, into the machine learning model, a second set of images of the segment of the wafer after the wafer has been etched; and adjusting weights of the machine learning model based on the first and second set of images, wherein the trained machine learning model is configured to generate predictive images of other portions of the segment of the developed wafer.

18. The method of clause 17, further comprising:

transforming the second set of images of the segment of the etched wafer into one or more feature maps by applying a convolutional neural network (CNN), wherein the one or more feature maps contain visual features of the second set of images of the segment of the etched wafer;

transforming the first set of images of the portion of the developed wafer into one or more feature maps by applying the CNN, wherein the one or more feature maps contain visual features of the first set of images of the portion of the developed wafer;

mapping the visual features associated with the second set of images of the segment of the etched wafer to the visual features associated with the first set of images of the portion of the developed wafer;

training a CNN encoder, using the mapping, to construct the first set of images of the portion of the developed wafer from the second set of images of the segment of the etched wafer;

extracting trained features from the construction, inputting the trained features into a CNN decoder; and adjusting weights of the CNN decoder by training the CNN decoder over the trained features.

19. The method of clause 18, wherein mapping the visual features comprises mapping the visual features associated with the set of images of the portion of the developed wafer to the visual features associated with a set of images of a first portion of the segment of the etched wafer.

20. The method of clause 19, wherein the first set of images of the portion of the developed wafer corresponds to the second set of images of the first portion of the segment of the etched wafer.

21. A charged particle multi-beam system for inspecting a wafer, the system comprising:

a controller including circuitry to:

image a portion of a segment of a wafer after a photoresist applied to the wafer has been developed;

image the segment of the wafer after the wafer has been etched; and train a machine learning model using the imaged portion of the developed wafer and the imaged segment of the etched wafer.

22. The system of clause 21, wherein the imaged segment of the etched wafer comprises a plurality of images.

23. The system of any one of clauses 21 or 22, wherein the imaged portion of the developed wafer comprises a plurality of images.

24. The system of any one of clauses 21-23, wherein training the machine learning model comprises:

transforming the imaged segment of the etched wafer into one or more feature maps by applying a convolutional neural network (CNN), wherein the one or more feature maps contain visual features of the imaged segment of the etched wafer;

transforming the imaged portion of the developed wafer into one or more feature maps by applying the CNN, wherein the one or more feature maps contain visual features of the imaged portion of the developed wafer;

mapping the visual features associated with the imaged segment of the etched wafer to the visual features associated with the imaged portion of the developed wafer;

training a CNN encoder, using the mapping, to construct the imaged portion of the developed wafer from the imaged segment of the etched wafer;

extracting trained features from the construction, inputting the trained features into a CNN decoder; and adjusting weights of the CNN decoder by training the CNN decoder over the trained features.

25. The system of clause 24, wherein mapping the visual features comprises mapping the visual features associated with the imaged portion of the developed wafer to the visual features associated with a first portion of the imaged segment of the etched wafer.

26. The system of clause 25, wherein the imaged portion of the developed wafer corresponds to the first portion of the imaged segment of the etched wafer.

27. The system of any one of clauses 21-25, wherein applying the trained machine learning model comprises using a second portion of the imaged segment of the etched wafer.

28. The system of clause 27, wherein the first portion of the imaged segment of the etched wafer is different from the second portion of the imaged segment of the etched wafer.

29. The system of any one of clauses 21-28, wherein applying the trained machine learning model comprises:

transforming the imaged segment of the etched wafer into one or more feature maps by applying a convolutional neural network (CNN), wherein the one or more feature maps contain visual features of the imaged segment of the etched wafer;

extracting the visual features associated with the imaged segment of the etched wafer using a CNN encoder, wherein the extraction comprises using one or more convolutional pooling layers to learn hierarchical features from the imaged segment of the etched wafer;

identifying trained features using the extracted visual features;

inputting the trained features into a CNN decoder; and generating predictive images of other portions of the segment of the developed wafer.

30. The system any one of clauses 21-29, wherein the machine learning model comprises a plurality of machine learning models.

31. The system of clause 30, wherein each machine learning model corresponds to a different segment of the wafer.

32. The system of any one of clauses 21-29, wherein applying the trained machine learning model comprises one machine learning model and inputting etching parameters that characterize etching of the wafer.

33. The system of any one of clauses 21-29, wherein applying the trained machine learning model comprises using the imaged segment of the etched wafer to generate predictive images of other portions of the segment of the developed wafer.

34. The system of any one of clauses 21-26, wherein the wafer is a first wafer.

35. The system of clause 34, comprising:

acquiring a second wafer after the second wafer has been etched;

imaging a segment of the etched second wafer; and applying the trained machine learning model using the imaged segment of the second etched wafer to generate predictive images of the segment of the second wafer after a photoresist applied to the second wafer has been developed.

36. The system of any one of clauses 34 and 35, wherein applying the trained machine learning model comprises:

transforming the imaged segment of the etched second wafer into one or more feature maps by applying a convolutional neural network (CNN), wherein the one or more feature maps contain visual features of the imaged segment of the etched second wafer;

extracting the visual features associated with the imaged segment of the etched second wafer using a CNN encoder, wherein the extraction comprises using one or more convolutional pooling layers to learn hierarchical features from the imaged segment of the etched second wafer;

identifying trained features using the extracted visual features;

inputting the trained features into a CNN decoder; and generating predictive images of the segment of the developed second wafer.

37. A non-transitory computer readable medium that stores a set of instructions that is executable by at least one processor of a computing device to cause the computing device to perform a method for inspecting a wafer, the method comprising:

imaging a portion of a segment of a wafer after a photoresist applied to the wafer has been developed;

imaging the segment of the wafer after the wafer has been etched;

training a machine learning model using the imaged portion of the developed wafer and the imaged segment of the etched wafer; and applying the trained machine learning model using the imaged segment of the etched wafer to generate predictive images of other portions of the segment of the developed wafer.

38. The non-transitory computer readable medium of clause 37, wherein the imaged segment of the etched wafer comprises a plurality of images.

39. The non-transitory computer readable medium of any one of clauses 37 or 38, wherein the imaged portion of the developed wafer comprises a plurality of images.

40. The non-transitory computer readable medium of any one of clauses 37-39, wherein training the machine learning model comprises:

transforming the imaged segment of the etched wafer into one or more feature maps by applying a convolutional neural network (CNN), wherein the one or more feature maps contain visual features of the imaged segment of the etched wafer;

transforming the imaged portion of the developed wafer into one or more feature maps by applying the CNN, wherein the one or more feature maps contain visual features of the imaged portion of the developed wafer;

mapping the visual features associated with the imaged segment of the etched wafer to the visual features associated with the imaged portion of the developed wafer;

training a CNN encoder, using the mapping, to construct the imaged portion of the developed wafer from the imaged segment of the etched wafer;

extracting trained features from the construction, inputting the trained features into a CNN decoder; and adjusting weights of the CNN decoder by training the CNN decoder over the trained features.

41. The non-transitory computer readable medium of clause 40, wherein mapping the visual features comprises mapping the visual features associated with the imaged portion of the developed wafer to the visual features associated with a first portion of the imaged segment of the etched wafer.

42. The non-transitory computer readable medium of clause 41, wherein the imaged portion of the developed wafer corresponds to the first portion of the imaged segment of the etched wafer.

43. The non-transitory computer readable medium of any one of clauses 37-42, wherein applying the trained machine learning model comprises using a second portion of the imaged segment of the etched wafer.

44. The non-transitory computer readable medium of clause 43, wherein the first portion of the imaged segment of the etched wafer is different from the second portion of the imaged segment of the etched wafer.

45. The non-transitory computer readable medium of any one of clauses 37-44, wherein applying the trained machine learning model comprises:

transforming the imaged segment of the etched wafer into one or more feature maps by applying a convolutional neural network (CNN), wherein the one or more feature maps contain visual features of the imaged segment of the etched wafer;

extracting the visual features associated with the imaged segment of the etched wafer using a CNN encoder, wherein the extraction comprises using one or more convolutional pooling layers to learn hierarchical features from the imaged segment of the etched wafer;

identifying trained features using the extracted visual features;

inputting the trained features into a CNN decoder; and generating predictive images of other portions of the segment of the developed wafer.

46. The non-transitory computer readable medium any one of clauses 37-45, wherein the machine learning model comprises a plurality of machine learning models.

47. The non-transitory computer readable medium of clause 46, wherein each machine learning model corresponds to a different segment of the wafer.

48. The non-transitory computer readable medium of any one of clauses 37-45, wherein applying the trained machine learning model comprises one machine learning model and inputting etching parameters that characterize etching of the wafer.

49. The non-transitory computer readable medium of any one of clauses 37-45, wherein applying the trained machine learning model comprises using the imaged segment of the etched wafer to generate predictive images of other portions of the segment of the developed wafer.

50. The non-transitory computer readable medium of any one of clauses 37-42, wherein the wafer is a first wafer.

51. The non-transitory computer readable medium of clause 50, comprising:

acquiring a second wafer after the second wafer has been etched;

imaging a segment of the etched second wafer; and applying the trained machine learning model using the imaged segment of the second etched wafer to generate predictive images of the segment of the second wafer after a photoresist applied to the second wafer has been developed.

52. The non-transitory computer readable medium of any one of clauses 50 or 51, wherein applying the trained machine learning model comprises:

transforming the imaged segment of the etched second wafer into one or more feature maps by applying a convolutional neural network (CNN), wherein the one or more feature maps contain visual features of the imaged segment of the etched second wafer;

extracting the visual features associated with the imaged segment of the etched second wafer using a CNN encoder, wherein the extraction comprises using one or more convolutional pooling layers to learn hierarchical features from the imaged segment of the etched second wafer;

identifying trained features using the extracted visual features;

inputting the trained features into a CNN decoder; and generating predictive images of the segment of the developed second wafer.

53. A method for generating a SEM image, comprising:

obtaining a first image of a feature of a wafer after the wafer has been etched;

analyzing the first image with a trained machine learning model; and generating, using the machine learning model, an image of a feature that is based on a photoresist application to the wafer corresponding to the feature of the first image.

54. The method of clause 53, wherein:

the machine learning model is trained based on a plurality of images of features of the wafer; and the plurality of images includes images of features after a photoresist is applied to the wafer and images of corresponding features after the wafer has been etched.

55. The method of clause 54, further comprising training the machine learning model by:

transforming the images of features of the etched wafer into one or more feature maps by applying a convolutional neural network (CNN), wherein the one or more feature maps contain visual features of the images of the etched wafer;

transforming the corresponding images of features after the photoresist is applied to the wafer into one or more feature maps by applying the CNN, wherein the one or more feature maps contain visual features of the images of the features after the photoresist is applied to the wafer;

mapping the visual features associated with the images of the etched wafer to the visual features associated with the images of the features after the photoresist is applied to the wafer;

training a CNN encoder, using the mapping, to construct the images of the features after the photoresist is applied to the wafer from the images of the etched wafer;

extracting trained features from the construction, inputting the trained features into a CNN decoder; and adjusting weights of the CNN decoder by training the CNN decoder over the trained features.

56. The method of any one of clauses 54 or 55, wherein the first image comprises a portion of the wafer that is different from portions of the wafer used to train the machine learning model.

57. The method of any one of clauses 53-56, wherein the machine learning model comprises:

transforming the first image into one or more feature maps by applying a convolutional neural network (CNN), wherein the one or more feature maps contain visual features of the first image;

extracting the visual features associated with the first image using a CNN encoder, wherein the extraction comprises using one or more convolutional pooling layers to learn hierarchical features from the first image;

identifying trained features using the extracted visual features; and inputting the trained features into a CNN decoder.

58. The method any one of clauses 53-57, wherein the first image comprises a plurality of images.

59. The method any one of clauses 53-58, wherein machine learning model comprises a plurality of machine learning models.

60. The method of clause 59, wherein each machine learning model corresponds to a different portion of the wafer.

61. The method of any one of clause 53-58, wherein the machine learning model is performed by one machine learning model, the method further comprising inputting etching parameters that characterize etching of the wafer.

62. The method of any one of clauses 53-55, wherein the wafer is a first wafer.

63. The method of clause 62, further comprising:

obtaining a second image of a feature of a second wafer after the second wafer has been etched;

analyzing the second image with the trained machine learning model; and generating, using the machine learning model, an image of a feature that is based on a photoresist application to the second wafer corresponding to the feature of the second image.

64. The method of clause 63, wherein the machine learning model of the second image comprises:

transforming the second image into one or more feature maps by applying a convolutional neural network (CNN), wherein the one or more feature maps contain visual features of the second image;

extracting the visual features associated with the second image using a CNN encoder, wherein the extraction comprises using one or more convolutional pooling layers to learn hierarchical features from the second image;

identifying trained features using the extracted visual features; and inputting the trained features into a CNN decoder.

65. A method of characterizing damage to a wafer caused by damage to a photoresist layer of the wafer induced by SEM imaging after development of the photoresist layer, the method comprising:

obtaining a first set of images of features of the wafer after the photoresist layer has been developed;

obtaining a second set of images of features of the wafer after the wafer has been etched;

training a machine learning model using the first and second sets of images;

generating a third set of images of approximate features that is based on photoresist layer application to the wafer, where the approximated features exclude damage induced by SEM imaging after development of the photoresist layer; and performing a statistical analysis based on the first, second, and third sets of images to generate a statistical characterization of SEM damage to the wafer.

66. The method of clause 65, wherein the first set of images comprises a portion of the wafer and a subset of the second set of images comprises the same portion of the wafer.

67. The method of clause 66, wherein training the machine learning model comprises:

transforming the subset of the second set of images into one or more feature maps by applying a convolutional neural network (CNN), wherein the one or more feature maps contain visual features of the subset of the second set of images;

transforming the first set of images into one or more feature maps by applying the CNN, wherein the one or more feature maps contain visual features of the first set of images;

mapping the visual features associated with the subset of the second set of images to the visual features associated with the first set of images;

training a CNN encoder, using the mapping, to construct the first set of images from the subset of the second set of images;

extracting trained features from the construction, inputting the trained features into a CNN decoder; and adjusting weights of the CNN decoder by training the CNN decoder over the trained features.

68. The method of any one of clauses 66 or 67, wherein the third set of images comprises a portion of the wafer that is different from portions of the wafer in the first and the subset of the second sets of images.

69. The method of any one of clauses 66-68, wherein generating the third set of images comprises:

transforming a subset of the second set of images, different from the subset of the second set of images used to train the machine learning model, into one or more feature maps by applying a convolutional neural network (CNN), wherein the one or more feature maps contain visual features of the subset of the second set of images;

extracting the visual features associated with the subset of the second set of images using a CNN encoder, wherein the extraction comprises using one or more convolutional pooling layers to learn hierarchical features from the subset of the second set of images;

identifying trained features using the extracted visual features;

inputting the trained features into a CNN decoder; and wherein generating the third set of images is based on the subset of the second set of images.

70. The method any one of clauses 65-69, wherein the machine learning model comprises a plurality of machine learning models.

71. The method of clause 70, wherein each machine learning model corresponds to a different portion of the wafer.

72. The method of any one of clauses 65-69, wherein generating the third set of images comprises one machine learning model and inputting etching parameters that characterize etching of the wafer.

73. The method of any one of clauses 9-13, 15-20, or 35-36, wherein the machine learning model uses a linear activation function in the output layer to generate the predictive images.

74. The method of clause 73, wherein the generated predictive images provide greyscale values.

75. The system of any one of clauses 29-33, wherein the machine learning model uses a linear activation function in the output layer to generate the predictive images.

76. The system of clause 75, wherein the generated predictive images provide greyscale values.

77. The non-transitory computer readable medium of any one of clauses 37-52, wherein the machine learning model uses a linear activation function in the output layer to generate the predictive images.

78. The non-transitory computer readable medium of clause 77, wherein the generated predictive images provide greyscale values.

79. The method of any one of clauses 53-64, wherein the machine learning model uses a linear activation function in the output layer to generate the predictive images.

80. The method of clause 79, wherein the generated SEM image provides greyscale values.

81. The method of any one of clauses 65-72, wherein the machine learning model uses a linear activation function in the output layer to generate the third set of images.

82. The method of clause 81, wherein the generated third set of images provides greyscale values.

83. A method for inspecting a wafer, comprising:
    acquiring the wafer after a photoresist applied to the wafer has been developed;
    imaging a segment of the developed wafer;
    acquiring the wafer after the wafer has been etched;
    imaging a portion of the segment of the etched wafer; and
    training a machine learning model using the imaged segment of the developed wafer and the imaged portion of the etched wafer.

84. The method of clause 83, wherein the imaged segment of the developed wafer comprises a plurality of images.

85. The method of any one of clauses 83 or 84, wherein the imaged portion of the etched wafer comprises a plurality of images.

86. The method of any one of clauses 83-85, wherein training the machine learning model comprises:
    transforming the imaged segment of the developed wafer into one or more feature maps by applying a convolutional neural network (CNN), wherein the one or more feature maps contain visual features of the imaged segment of the developed wafer;
    transforming the imaged portion of the etched wafer into one or more feature maps by applying the CNN, wherein the one or more feature maps contain visual features of the imaged portion of the etched wafer;
    mapping the visual features associated with the imaged segment of the developed wafer to the visual features associated with the imaged portion of the etched wafer;
    training a CNN encoder, using the mapping, to construct the imaged portion of the etched wafer from the imaged segment of the developed wafer;
    extracting trained features from the construction,
    inputting the trained features into a CNN decoder; and
    adjusting weights of the CNN decoder by training the CNN decoder over the trained features.

87. The method of clause 86, wherein mapping the visual features comprises mapping the visual features associated with the imaged portion of the etched wafer to the visual features associated with a first portion of the imaged segment of the developed wafer.

88. The method of clause 87, wherein the imaged portion of the etched wafer corresponds to the first portion of the imaged segment of the developed wafer.

89. The method of any one of clauses 83-88, wherein applying the trained machine learning model comprises using a second portion of the imaged segment of the developed wafer.

90. The method of clause 89, wherein the first portion of the imaged segment of the developed wafer is different from the second portion of the imaged segment of the developed wafer.

91. The method of any one of clauses 83-90, wherein applying the trained machine learning model comprises:
    transforming the imaged segment of the developed wafer into one or more feature maps by applying a convolutional neural network (CNN), wherein the one or more feature maps contain visual features of the imaged segment of the developed wafer;
    extracting the visual features associated with the imaged segment of the developed wafer using a CNN encoder, wherein the extraction comprises using one or more convolutional pooling layers to learn hierarchical features from the imaged segment of the developed wafer;
    identifying trained features using the extracted visual features;
    inputting the trained features into a CNN decoder; and
    generating predictive after-etch images of other portions of the segment of the developed wafer.

92. The method any one of clauses 83-91, wherein the machine learning model comprises a plurality of machine learning models.

93. The method of clause 92, wherein each machine learning model corresponds to a different segment of the wafer.

94. The method of any one of clauses 83-91, wherein applying the trained machine learning model comprises one machine learning model and inputting etching parameters that characterize etching of the wafer.

95. The method of any one of clauses 83-91, wherein applying the trained machine learning model comprises using the imaged segment of the developed wafer to generate predictive after-etch images of other portions of the segment of the developed wafer.

96. The method of any one of clauses 83-88, wherein the wafer is a first wafer.

97. The method of clause 95, comprising:
    acquiring a second wafer after a photoresist applied to the second wafer has been developed;
    imaging a segment of the developed second wafer; and
    applying the trained machine learning model using the imaged segment of the second developed wafer to generate predictive after-etch images of the segment of the second wafer after a photoresist applied to the second wafer has been developed.

98. The method of any one of clauses 95-96, wherein applying the trained machine learning model comprises:
    transforming the imaged segment of the developed second wafer into one or more feature maps by applying a convolutional neural network (CNN), wherein the one or more feature maps contain visual features of the imaged segment of the developed second wafer;
    extracting the visual features associated with the imaged segment of the developed second wafer using a CNN encoder, wherein the extraction comprises using one or more convolutional pooling layers to learn hierarchical features from the imaged segment of the developed second wafer;
    identifying trained features using the extracted visual features;
    inputting the trained features into a CNN decoder; and
    generating predictive after-etch images of the segment of the developed second wafer.

99. The method of any one of clauses 91-95 or 97-98, wherein the machine learning model uses a sigmoid activation function in an output layer to generate the predictive after-etch images.

100. The method of clause 99, wherein the predictive after-etch images are binarized.

101. A method for training a machine learning model, the method comprising
    inputting, into the machine learning model, a first set of images of a segment of a first wafer after a photoresist applied to the first wafer has been developed;
    inputting, into the machine learning model, a second set of images of a portion of the segment of the first wafer after the first wafer has been etched; and
    adjusting weights of the machine learning model based on the first and second set of images, wherein the trained machine learning model is configured to generate predictive after-etch images of a second wafer.

102. The method of clause 101, further comprising:

transforming the first set of images of the segment of the developed first wafer into one or more feature maps by applying a convolutional neural network (CNN), wherein the one or more feature maps contain visual features of the first set of images of the segment of the developed first wafer;

transforming the second set of images of the portion of the etched first wafer into one or more feature maps by applying the CNN, wherein the one or more feature maps contain visual features of the second set of images of the portion of the etched first wafer;

mapping the visual features associated with the first set of images of the segment of the developed first wafer to the visual features associated with the second set of images of the portion of the etched first wafer;

training a CNN encoder, using the mapping, to construct the second set of images of the portion of the etched first wafer from the first set of images of the segment of the developed first wafer;

extracting trained features from the construction, inputting the trained features into a CNN decoder; and adjusting weights of the CNN decoder by training the CNN decoder over the trained features.

103. The method of clause 102, wherein mapping the visual features comprises mapping the visual features associated with the set of images of the portion of the etched first wafer to the visual features associated with a set of images of a first portion of the segment of the developed first wafer.

104. The method of clause 103, wherein the second set of images of the portion of the etched wafer corresponds to the first set of images of the first portion of the segment of the first developed wafer.

105. The method of any one of clauses 101-104, wherein the machine learning model uses a sigmoid activation function in an output layer to generate the predictive after-etch images.

106. The method of clause 105, wherein the predictive after-etch images are binarized.

107. A charged particle multi-beam system for inspection, the system comprising:

a controller including circuitry to:

image a segment of a wafer after a photoresist applied to the wafer has been developed;

image a portion of the segment of the wafer after the wafer has been etched; and train a machine learning model using the imaged segment of the developed wafer and the imaged portion of the segment of the etched wafer.

108. The system of clause 107, wherein the imaged segment of the developed wafer comprises a plurality of images.

109. The system of any one of clauses 107-108, wherein the imaged portion of the etched wafer comprises a plurality of images.

110. The system of any one of clauses 107-109, wherein training the machine learning model comprises:

transforming the imaged segment of the developed wafer into one or more feature maps by applying a convolutional neural network (CNN), wherein the one or more feature maps contain visual features of the imaged segment of the developed wafer;

transforming the imaged portion of the etched wafer into one or more feature maps by applying the CNN, wherein the one or more feature maps contain visual features of the imaged portion of the etched wafer;

mapping the visual features associated with the imaged segment of the developed wafer to the visual features associated with the imaged portion of the etched wafer;

training a CNN encoder, using the mapping, to construct the imaged portion of the etched wafer from the imaged segment of the developed wafer;

extracting trained features from the construction, inputting the trained features into a CNN decoder; and adjusting weights of the CNN decoder by training the CNN decoder over the trained features.

111. The system of clause 110, wherein mapping the visual features comprises mapping the visual features associated with the imaged portion of the etched wafer to the visual features associated with a first portion of the imaged segment of the developed wafer.

112. The system of clause 111, wherein the imaged portion of the etched wafer corresponds to the first portion of the imaged segment of the developed wafer.

113. The system of any one of clauses 107-112, wherein applying the trained machine learning model comprises using a second portion of the imaged segment of the developed wafer.

114. The system of clause 113, wherein the first portion of the imaged segment of the developed wafer is different from the second portion of the imaged segment of the developed wafer.

115. The system of any one of clauses 107-114, wherein applying the trained machine learning model comprises:

transforming the imaged segment of the developed wafer into one or more feature maps by applying a convolutional neural network (CNN), wherein the one or more feature maps contain visual features of the imaged segment of the developed wafer;

extracting the visual features associated with the imaged segment of the developed wafer using a CNN encoder, wherein the extraction comprises using one or more convolutional pooling layers to learn hierarchical features from the imaged segment of the developed wafer;

identifying trained features using the extracted visual features;

inputting the trained features into a CNN decoder; and generating predictive after-etch images of other portions of the segment of the developed wafer.

116. The system any one of clauses 107-115, wherein the machine learning model comprises a plurality of machine learning models.

117. The system of clause 116, wherein each machine learning model corresponds to a different segment of the wafer.

118. The system of any one of clauses 107-115, wherein applying the trained machine learning model comprises one machine learning model and inputting etching parameters that characterize etching of the wafer.

119. The system of any one of clauses 107-115, wherein applying the trained machine learning model comprises using the imaged segment of the developed wafer to generate predictive after-etch images of other portions of the segment of the developed wafer.

120. The system of any one of clauses 107-112, wherein the wafer is a first wafer.

121. The system of clause 120, comprising:

acquiring a second wafer after a photoresist applied to the second wafer has been developed;

imaging a segment of the developed second wafer; and applying the trained machine learning model using the imaged segment of the second developed wafer to generate predictive after-etch images of the segment of the second wafer after a photoresist applied to the second wafer has been developed.

122. The system of any one of clauses 120-121, wherein applying the trained machine learning model comprises:

transforming the imaged segment of the developed second wafer into one or more feature maps by applying a convolutional neural network (CNN), wherein the one or more feature maps contain visual features of the imaged segment of the developed second wafer;

extracting the visual features associated with the imaged segment of the developed second wafer using a CNN encoder, wherein the extraction comprises using one or more convolutional pooling layers to learn hierarchical features from the imaged segment of the developed second wafer;

identifying trained features using the extracted visual features;

inputting the trained features into a CNN decoder; and generating predictive after-etch images of the segment of the developed second wafer.

123. The system of any one of clauses 115-119 or 121-122, wherein the machine learning model uses a sigmoid activation function in an output layer to generate the predictive after-etch images.

124. The system of clause 123, wherein the predictive after-etch images are binarized.

125. A non-transitory computer readable medium that stores a set of instructions that is executable by at least one processor of a computing device to cause the computing device to perform a method for inspecting a wafer, the method comprising:

imaging a segment of a first wafer after a photoresist applied to the first wafer has been developed;

imaging a portion of the segment of the first wafer after the first wafer has been etched;

training a machine learning model using the imaged segment of the developed first wafer and the imaged portion of the etched first wafer; and applying the trained machine learning model using an imaged segment of a developed second wafer to generate predictive after-etch images of the developed second wafer.

126. The non-transitory computer readable medium of clause 125, wherein the imaged segment of the developed first wafer comprises a plurality of images.

127. The non-transitory computer readable medium of any one of clauses 125-126, wherein the imaged portion of the etched first wafer comprises a plurality of images.

128. The non-transitory computer readable medium of any one of clauses 125-127, wherein training the machine learning model comprises:

transforming the imaged segment of the first developed wafer into one or more feature maps by applying a convolutional neural network (CNN), wherein the one or more feature maps contain visual features of the imaged segment of the developed first wafer;

transforming the imaged portion of the etched first wafer into one or more feature maps by applying the CNN, wherein the one or more feature maps contain visual features of the imaged portion of the etched first wafer;

mapping the visual features associated with the imaged segment of the developed first wafer to the visual features associated with the imaged portion of the etched first wafer;

training a CNN encoder, using the mapping, to construct the imaged portion of the etched first wafer from the imaged segment of the developed first wafer;

extracting trained features from the construction, inputting the trained features into a CNN decoder; and adjusting weights of the CNN decoder by training the CNN decoder over the trained features.

129. The non-transitory computer readable medium of clause 128, wherein mapping the visual features comprises mapping the visual features associated with the imaged portion of the etched first wafer to the visual features associated with a first portion of the imaged segment of the developed first wafer.

130. The non-transitory computer readable medium of clause 129, wherein the imaged portion of the etched first wafer corresponds to the first portion of the imaged segment of the developed first wafer.

131. The non-transitory computer readable medium of any one of clauses 125-130, wherein the second wafer is the first wafer and applying the trained machine learning model comprises using a second portion of the imaged segment of the developed first wafer.

132. The non-transitory computer readable medium of clause 131, wherein the first portion of the imaged segment of the developed first wafer is different from the second portion of the imaged segment of the developed first wafer.

133. The non-transitory computer readable medium of any one of clauses 125-132, wherein applying the trained machine learning model comprises:

transforming the imaged segment of the developed first wafer into one or more feature maps by applying a convolutional neural network (CNN), wherein the one or more feature maps contain visual features of the imaged segment of the developed first wafer;

extracting the visual features associated with the imaged segment of the developed first wafer using a CNN encoder, wherein the extraction comprises using one or more convolutional pooling layers to learn hierarchical features from the imaged segment of the developed first wafer;

identifying trained features using the extracted visual features;

inputting the trained features into a CNN decoder; and generating predictive after-etch images of other portions of the segment of the developed first wafer.

134. The non-transitory computer readable medium any one of clauses 125-133, wherein the machine learning model comprises a plurality of machine learning models.

135. The non-transitory computer readable medium of clause 134, wherein each machine learning model corresponds to a different segment of the first wafer.

136. The non-transitory computer readable medium of any one of clauses 125-133, wherein applying the trained machine learning model comprises one machine learning model and inputting etching parameters that characterize etching of the first wafer.

137. The non-transitory computer readable medium of any one of clauses 125-133, wherein applying the trained machine learning model comprises using the imaged segment of the developed first wafer to generate predictive after-etch images of other portions of the segment of the developed first wafer.

138. The non-transitory computer readable medium of any one of clauses 125-130, wherein the second wafer is different from the first wafer.

139. The non-transitory computer readable medium of clause 138, comprising:

acquiring the second wafer after a photoresist applied to the second wafer has been developed;

imaging a segment of the developed second wafer; and applying the trained machine learning model using the imaged segment of the second developed wafer to generate predictive after-etch images of the segment of the second wafer after a photoresist applied to the second wafer has been developed.

140. The non-transitory computer readable medium of any one of clauses 138-139, wherein applying the trained machine learning model comprises:

transforming the imaged segment of the developed second wafer into one or more feature maps by applying a convolutional neural network (CNN), wherein the one or more feature maps contain visual features of the imaged segment of the developed second wafer;

extracting the visual features associated with the imaged segment of the developed second wafer using a CNN encoder, wherein the extraction comprises using one or more convolutional pooling layers to learn hierarchical features from the imaged segment of the developed second wafer;

identifying trained features using the extracted visual features;

inputting the trained features into a CNN decoder; and generating predictive after-etch images of the segment of the developed second wafer.

141. The non-transitory computer readable medium of any one of clauses 125-140, wherein the machine learning model uses a sigmoid activation function in an output layer to generate the predictive after-etch images.

142. The non-transitory computer readable medium of clause 141, wherein the predictive after-etch images are binarized.

143. A method for generating a SEM image, comprising:

obtaining a first image of a feature of a wafer after a photoresist has been applied to the wafer;

analyzing the first image with a trained machine learning model; and generating, using the machine learning model, a predictive image of a feature that is based on an etching application to the wafer corresponding to the feature of the first image.

144. The method of clause 143, wherein:

the machine learning model is trained based on a plurality of images of features of the wafer; and the plurality of images includes images of features after a photoresist is applied to the wafer and images of corresponding features after the wafer has been etched.

145. The method of clause 144, further comprising training the machine learning model by:

transforming the images of features of the etched wafer into one or more feature maps by applying a convolutional neural network (CNN), wherein the one or more feature maps contain visual features of the images of the etched wafer;

transforming the corresponding images of features after the photoresist is applied to the wafer into one or more feature maps by applying the CNN, wherein the one or more feature maps contain visual features of the images of the features after the photoresist is applied to the wafer;

mapping the visual features associated with the images of the features after the photoresist is applied to the wafer to the visual features associated with the images of the etched wafer;

training a CNN encoder, using the mapping, to construct the images of the features after the wafer is etched from images of the features after the photoresist is applied to the wafer;

extracting trained features from the construction, inputting the trained features into a CNN decoder; and adjusting weights of the CNN decoder by training the CNN decoder over the trained features.

146. The method of any one of clauses 144-145, wherein the first image comprises a portion of the wafer that is different from portions of the wafer used to train the machine learning model.

147. The method of any one of clauses 143-146, wherein the machine learning model comprises:

transforming the first image into one or more feature maps by applying a convolutional neural network (CNN), wherein the one or more feature maps contain visual features of the first image;

extracting the visual features associated with the first image using a CNN encoder, wherein the extraction comprises using one or more convolutional pooling layers to learn hierarchical features from the first image;

identifying trained features using the extracted visual features; and inputting the trained features into a CNN decoder.

148. The method any one of clauses 143-147, wherein the first image comprises a plurality of images.

149. The method any one of clauses 143-148, wherein the machine learning model comprises a plurality of machine learning models.

150. The method of clause 149, wherein each machine learning model corresponds to a different portion of the wafer.

151. The method of any one of clauses 143-148, further comprising inputting etching parameters that characterize etching of the wafer.

152. The method of any one of clauses 143-145, wherein the wafer is a first wafer.

153. The method of clause 152, further comprising:

obtaining a second image of a feature of a second wafer after a photoresist applied to the wafer has been developed;

analyzing the second image with the trained machine learning model; and generating, using the machine learning analysis, a predictive image of a feature that is based on an etching application to the second wafer corresponding to the feature of the second image.

154. The method of clause 153, wherein the machine learning model of the second image comprises:

transforming the second image into one or more feature maps by applying a convolutional neural network (CNN), wherein the one or more feature maps contain visual features of the second image;

extracting the visual features associated with the second image using a CNN encoder, wherein the extraction comprises using one or more convolutional pooling layers to learn hierarchical features from the second image;

identifying trained features using the extracted visual features; and inputting the trained features into a CNN decoder.

155. The method of any one of clauses 143-154, wherein the machine learning model uses a sigmoid activation function in an output layer to calculate the generated the predictive image.

156. The method of clause 155, wherein the generated predictive image is binarized.

157. The method of any one of clauses 101-106, wherein the portion of the segment is entirely the segment.

A non-transitory computer readable medium may be provided that stores instructions for a processor of a controller (e.g., controller 109 of FIG. 1) for controlling wafer inspection, consistent with embodiments in the present disclosure. For example, based on the step of the wafer inspection process (e.g., after development, after etching), the controller may perform the training of the machine learning model and execute the trained machine learning model. image the wafer. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for using a generated SEM image for wafer inspection, comprising:

obtaining a first image of a feature of a first wafer after the first wafer has been etched;

analyzing the first image with a trained machine learning model configured to;

receive images of the first wafer after the first wafer has been etched; and generate images of the first wafer based on a photoresist application to the first wafer; and generating, using the machine learning model and without using an image of the feature after a photoresist applied to the first wafer has been developed, an after development image of the feature of the first wafer corresponding to the feature of the first image.

2. The method of claim 1, wherein:

the machine learning model is trained based on a plurality of images of features of the first wafer; and the plurality of images includes images of features after a photoresist is applied to the first wafer and images of corresponding features after the first wafer has been etched.

3. The method of claim 2, further comprising training the machine learning model by:

transforming the images of features of the etched first wafer into one or more feature maps by applying a convolutional neural network (CNN), wherein the one or more feature maps contain visual features of the images of the etched first wafer.

4. The method of claim 3, further comprising:

transforming the corresponding images of features after the photoresist is applied to the first wafer into one or more feature maps by applying the CNN, wherein the one or more feature maps contain visual features of the images of the features after the photoresist is applied to the first wafer; and mapping the visual features associated with the images of the etched first wafer to the visual features associated with the images of the features after the photoresist is applied to the first wafer.

5. The method of claim 4, further comprising:

training a CNN encoder, using the mapping, to construct the images of the features after the photoresist is applied to the first wafer from the images of the etched first wafer;

extracting trained features from the construction, inputting the trained features into a CNN decoder; and adjusting weights of the CNN decoder by training the CNN decoder over the trained features.

6. The method of claim 2, wherein the first image comprises a portion of the first wafer that is different from portions of the first wafer used to train the machine learning model.

7. The method of claim 1, wherein the machine learning model is further configured to:

transform the first image into one or more feature maps by applying a convolutional neural network (CNN), wherein the one or more feature maps contain visual features of the first image;

extract the visual features associated with the first image using a CNN encoder, wherein the extraction comprises using one or more convolutional pooling layers to learn hierarchical features from the first image;

identify trained features using the extracted visual features; and input the trained features into a CNN decoder.

8. The method of claim 1, wherein the first image comprises a plurality of images.

9. The method of claim 1, wherein the machine learning model comprises a plurality of machine learning models.

10. The method of claim 9, wherein each machine learning model corresponds to a different portion of the first wafer.

11. The method of claim 1, wherein the machine learning model is performed by one machine learning model, the method further comprising inputting etching parameters that characterize etching of the first wafer.

12. The method of claim 1, further comprising:

obtaining a second image of a feature of a third wafer after the third wafer has been etched;

analyzing the second image with the trained machine learning model; and generating, using the machine learning model, an image of a feature that is based on a photoresist application to the third wafer corresponding to the feature of the second image.

13. The method of claim 12, wherein the machine learning model of the second image is configured to:

transform the second image into one or more feature maps by applying a convolutional neural network (CNN), wherein the one or more feature maps contain visual features of the second image;

extract the visual features associated with the second image using a CNN encoder, wherein the extraction comprises using one or more convolutional pooling layers to learn hierarchical features from the second image;

identify trained features using the extracted visual features; and input the trained features into a CNN decoder.

14. The method of claim 1, further comprising:

performing metrology on the generated image of the first wafer to enable reworking a second wafer using the metrology results prior to etching the second wafer.

15. A charged particle multi-beam system for using a generated image for wafer inspection, the system comprising:

a controller including circuitry to:

image a portion of a segment of a first wafer after a photoresist applied to the first wafer has been developed;

image the segment of the first wafer after the first wafer has been etched;

train a machine learning model using the imaged portion of the developed first wafer and the imaged segment of the etched first wafer; and wherein the trained machine learning model is used to generate, without using an image of a portion of the first wafer after a photoresist applied to the wafer has been developed, an after development image of the portion of the first wafer.

16. The system of claim 15, wherein training the machine learning model comprises:

transforming the imaged segment of the etched first wafer into one or more feature maps by applying a convolutional neural network (CNN), wherein the one or more feature maps contain visual features of the imaged segment of the etched first wafer.

17. The system of claim 16, wherein training of the machine learning model further comprises:

transformation of the imaged portion of the developed first wafer into one or more feature maps by applying the CNN, wherein the one or more feature maps contain visual features of the imaged portion of the developed first wafer; and mapping of the visual features associated with the imaged segment of the etched first wafer to the visual features associated with the imaged portion of the developed first wafer.

18. The system of claim 17, wherein training the machine learning model further comprises:

training of a CNN encoder, using the mapping, to construct the imaged portion of the developed first wafer from the imaged segment of the etched first wafer;

extraction of trained features from the construction, inputting of the trained features into a CNN decoder; and adjustment of weights of the CNN decoder by training the CNN decoder over the trained features.

19. The system of claim 15, wherein;

the imaged segment of the etched first wafer comprises a plurality of images; and the imaged portion of the developed first wafer comprises a plurality of images.

* * * * *